United States Patent
Campbell et al.

(10) Patent No.: US 7,609,077 B2
(45) Date of Patent: Oct. 27, 2009

(54) DIFFERENTIAL SIGNAL PROBE WITH INTEGRAL BALUN

(75) Inventors: Richard Campbell, Portland, OR (US); Eric W. Strid, Portland, OR (US); Mike Andrews, Cornelius, OR (US)

(73) Assignee: Cascade Microtech, Inc., Beaverton, OR (US)

( * ) Notice: Subject to any disclaimer, the term of this patent is extended or adjusted under 35 U.S.C. 154(b) by 2 days.

(21) Appl. No.: 11/811,682

(22) Filed: Jun. 11, 2007

(65) Prior Publication Data
US 2008/0012591 A1 Jan. 17, 2008

Related U.S. Application Data

(60) Provisional application No. 60/812,150, filed on Jun. 9, 2006.

(51) Int. Cl.
G01R 31/02 (2006.01)
(52) U.S. Cl. .................................................. 324/754
(58) Field of Classification Search ........................ None
See application file for complete search history.

(56) References Cited

U.S. PATENT DOCUMENTS

| | | | |
|---|---|---|---|
| 491,783 A | 2/1893 | Moyer |
| 1,337,866 A | 4/1920 | Whitacker |
| 2,142,625 A | 1/1939 | Zoethout |
| 2,376,101 A | 5/1945 | Tyzzer |
| 2,389,668 A | 11/1945 | Johnson |
| 2,545,258 A | 3/1951 | Cailloux |
| 2,762,234 A | 9/1956 | Dodd |
| 2,901,696 A | 8/1959 | Möllfors |
| 2,921,276 A | 1/1960 | Fubini |
| 2,947,939 A | 8/1960 | Harwig |
| 3,176,091 A | 3/1965 | Hanson, et al. |
| 6,176,091 B1 | 3/1965 | Hanson et al. |
| 3,193,712 A * | 7/1965 | Harris ..................... 307/147 |
| 3,218,584 A | 11/1965 | Ayer |
| 3,230,299 A | 1/1966 | Radziekowski |
| 3,262,593 A | 7/1966 | Hainer |
| 3,396,598 A | 8/1968 | Grispo |
| 3,401,126 A | 9/1968 | Miller et al. |
| 3,429,040 A | 2/1969 | Miller |
| 3,445,770 A | 5/1969 | Harmon |
| 3,484,679 A | 12/1969 | Hodgson et al. |

(Continued)

FOREIGN PATENT DOCUMENTS

CH    607 045    11/1978

(Continued)

OTHER PUBLICATIONS

The Micromanipulator Company, data sheet, Double Sided Probing System, Jul. 2002, 2 pages.

(Continued)

*Primary Examiner*—Ha Tran T Nguyen
*Assistant Examiner*—Roberto Velez
(74) *Attorney, Agent, or Firm*—Chernoff, Vilhauer, McClung & Stenzel

(57) ABSTRACT

A probe with integral balun enables connecting a device utilizing differential signals to a source or a sink of single ended signals.

22 Claims, 6 Drawing Sheets

U.S. PATENT DOCUMENTS

| | | |
|---|---|---|
| 3,541,222 A | 11/1970 | Parks et al. |
| 3,561,280 A | 2/1971 | MacPhee et al. |
| 3,573,617 A | 4/1971 | Randolph et al. |
| 3,596,228 A | 7/1971 | Reed et al. |
| 3,609,539 A | 9/1971 | Gunthert |
| 3,611,199 A | 10/1971 | Safran |
| 3,619,780 A | 11/1971 | Hoeks |
| 3,622,915 A | 11/1971 | Davo |
| 3,634,807 A | 1/1972 | Grobe et al. |
| 3,648,169 A | 3/1972 | Wiesler |
| 3,654,585 A | 4/1972 | Wickersham |
| 3,662,318 A | 5/1972 | Decuyper |
| 3,680,037 A | 7/1972 | Nellis et al. |
| 3,686,624 A | 8/1972 | Napoli et al. |
| 3,700,998 A | 10/1972 | Lee et al. |
| 3,705,379 A | 12/1972 | Bogar |
| 3,710,251 A | 1/1973 | Hagge et al. |
| 3,714,572 A | 1/1973 | Ham et al. |
| 3,725,829 A | 4/1973 | Brown |
| 3,740,900 A | 6/1973 | Youmans et al. |
| 3,766,470 A | 10/1973 | Hay et al. |
| 3,803,709 A | 4/1974 | Beltz et al. |
| 3,806,801 A | 4/1974 | Bove |
| 3,810,016 A | 5/1974 | Chayka, et al. |
| 3,829,076 A | 8/1974 | Sofy |
| 3,833,852 A | 9/1974 | Schoch |
| 3,839,672 A | 10/1974 | Anderson |
| 3,849,728 A | 11/1974 | Evans |
| 3,858,212 A | 12/1974 | Tompkins et al. |
| 3,862,790 A | 1/1975 | Davies et al. |
| 3,866,093 A | 2/1975 | Kusters et al. |
| 3,867,698 A | 2/1975 | Beltz, et al. |
| 3,882,597 A | 5/1975 | Chayka, et al. |
| 3,930,809 A | 1/1976 | Evans |
| 3,936,743 A | 2/1976 | Roch |
| 3,952,156 A | 4/1976 | Lahr |
| 3,970,934 A | 7/1976 | Aksu |
| 3,971,610 A | 7/1976 | Buchoff et al. |
| 3,976,959 A | 8/1976 | Gaspari |
| 3,992,073 A | 11/1976 | Buchoff et al. |
| 4,001,685 A | 1/1977 | Roch |
| 4,008,900 A | 2/1977 | Khoshaba |
| 4,009,456 A | 2/1977 | Hopfer |
| 4,027,935 A | 6/1977 | Byrnes et al. |
| 4,035,723 A | 7/1977 | Kvaternik |
| 4,038,599 A | 7/1977 | Bove et al. |
| 4,038,894 A | 8/1977 | Knibbe et al. |
| 4,049,252 A | 9/1977 | Bell |
| 4,063,195 A | 12/1977 | Abrams et al. |
| 4,066,943 A | 1/1978 | Roch |
| 4,072,576 A | 2/1978 | Arwin et al. |
| 4,074,201 A | 2/1978 | Lennon |
| 4,093,988 A | 6/1978 | Scott |
| 4,099,120 A | 7/1978 | Aksu |
| 4,115,735 A | 9/1978 | Stanford |
| 4,116,523 A | 9/1978 | Coberly |
| 4,123,706 A | 10/1978 | Roch |
| 4,124,787 A | 11/1978 | Aamoth et al. |
| 4,135,131 A | 1/1979 | Larsen et al. |
| 4,151,465 A | 4/1979 | Lenz |
| 4,161,692 A | 7/1979 | Tarzwell |
| 4,177,421 A | 12/1979 | Thornburg |
| 4,184,133 A | 1/1980 | Gehle |
| 4,184,729 A | 1/1980 | Parks et al. |
| 4,216,467 A | 8/1980 | Colston |
| 4,225,819 A | 9/1980 | Grau et al. |
| 4,232,398 A | 11/1980 | Gould et al. |
| 4,251,772 A | 2/1981 | Worsham et al. |
| 4,275,446 A | 6/1981 | Blaess |
| 4,277,741 A | 7/1981 | Faxvog et al. |
| 4,280,112 A | 7/1981 | Eisenhart |
| 4,284,033 A | 8/1981 | del Rio |
| 4,284,682 A | 8/1981 | Tshirch et al. |
| 4,287,473 A | 9/1981 | Sawyer |
| 4,302,146 A | 11/1981 | Finlayson et al. |
| 4,306,235 A | 12/1981 | Christmann |
| 4,312,117 A | 1/1982 | Robillard et al. |
| 4,327,180 A | 4/1982 | Chen |
| 4,330,783 A | 5/1982 | Toia |
| 4,340,860 A | 7/1982 | Teeple, Jr. |
| 4,346,355 A | 8/1982 | Tsukii |
| 4,357,575 A | 11/1982 | Uren et al. |
| 4,375,631 A | 3/1983 | Goldberg |
| 4,376,920 A | 3/1983 | Smith |
| 4,383,217 A | 5/1983 | Shiell |
| 4,401,945 A | 8/1983 | Juengel |
| 4,425,395 A | 1/1984 | Negishi et al. |
| 4,453,142 A | 6/1984 | Murphy |
| 4,468,629 A | 8/1984 | Choma, Jr. |
| 4,476,363 A | 10/1984 | Berggren et al. |
| 4,480,223 A | 10/1984 | Aigo |
| 4,487,996 A | 12/1984 | Rabinowitz et al. |
| 4,491,783 A | 1/1985 | Sawayama et al. |
| 4,502,028 A | 2/1985 | Leake |
| 4,515,133 A | 5/1985 | Roman |
| 4,515,439 A | 5/1985 | Esswein |
| 4,520,314 A | 5/1985 | Asch et al. |
| 4,528,504 A | 7/1985 | Thornton, Jr. et al. |
| 4,531,474 A | 7/1985 | Inuta |
| 4,551,747 A | 11/1985 | Gilbert et al. |
| 4,552,033 A | 11/1985 | Marzhauser |
| 4,553,111 A | 11/1985 | Barrow |
| 4,558,609 A | 12/1985 | Kim |
| 4,563,640 A | 1/1986 | Hasegawa |
| 4,567,321 A | 1/1986 | Harayama |
| 4,567,436 A | 1/1986 | Koch |
| 4,568,890 A | 2/1986 | Bates |
| 4,581,679 A | 4/1986 | Smolley |
| 4,588,950 A | 5/1986 | Henley |
| 4,589,815 A | 5/1986 | Smith |
| 4,593,243 A | 6/1986 | Lao et al. |
| 4,600,907 A | 7/1986 | Grellman et al. |
| 4,621,169 A | 11/1986 | Petinelli et al. |
| 4,626,618 A | 12/1986 | Takaoka et al. |
| 4,626,805 A | 12/1986 | Jones |
| 4,636,722 A | 1/1987 | Ardezzone |
| 4,636,772 A | 1/1987 | Yasunaga |
| 4,641,659 A | 2/1987 | Sepponen |
| 4,642,417 A | 2/1987 | Ruthrof et al. |
| 4,646,005 A | 2/1987 | Ryan |
| 4,649,339 A | 3/1987 | Grangroth et al. |
| 4,651,115 A | 3/1987 | Wu |
| 4,652,082 A | 3/1987 | Warner |
| 4,653,174 A | 3/1987 | Gilder et al. |
| 4,663,840 A | 5/1987 | Ubbens et al. |
| 4,669,805 A | 6/1987 | Kosugi et al. |
| 4,673,839 A | 6/1987 | Veenendaal |
| 4,684,883 A | 8/1987 | Ackerman et al. |
| 4,684,884 A | 8/1987 | Soderlund |
| 4,685,150 A | 8/1987 | Maier |
| 4,691,163 A | 9/1987 | Blass et al. |
| 4,696,544 A | 9/1987 | Costella |
| 4,697,143 A | 9/1987 | Lockwood et al. |
| 4,705,447 A | 11/1987 | Smith |
| 4,706,050 A | 11/1987 | Andrews |
| 4,707,657 A | 11/1987 | Bøegh-Petersen |
| 4,711,563 A | 12/1987 | Lass |
| 4,713,347 A | 12/1987 | Mitchell et al. |
| 4,714,873 A | 12/1987 | McPherson et al. |
| 4,725,793 A | 2/1988 | Igarashi |
| 4,727,319 A | 2/1988 | Shahriary |
| 4,727,391 A | 2/1988 | Tajima et al. |
| 4,727,637 A | 3/1988 | Buckwitz et al. |
| 4,734,641 A | 3/1988 | Byrd, Jr. et al. |

| | | | | | |
|---|---|---|---|---|---|
| 4,739,259 A | 4/1988 | Hadwin et al. | 5,001,423 A | 3/1991 | Abrami |
| 4,740,764 A | 4/1988 | Gerlack | 5,003,253 A | 3/1991 | Majidi-Ahy et al. |
| 4,742,571 A | 5/1988 | Letron | 5,007,163 A | 4/1991 | Pope et al. |
| 4,744,041 A | 5/1988 | Strunk et al. | 5,012,186 A | 4/1991 | Gleason |
| 4,746,857 A | 5/1988 | Sakai et al. | 5,020,219 A | 6/1991 | Leedy |
| 4,749,942 A | 6/1988 | Sang et al. | 5,021,186 A | 6/1991 | Ota et al. |
| 4,754,239 A | 6/1988 | Sedivec | 5,030,907 A | 7/1991 | Yih et al. |
| 4,755,742 A | 7/1988 | Mallory et al. | 5,041,782 A | 8/1991 | Marzan |
| 4,755,746 A | 7/1988 | Mallory et al. | 5,045,781 A | 9/1991 | Gleason et al. |
| 4,755,747 A | 7/1988 | Sato | 5,059,898 A | 10/1991 | Barsotti et al. |
| 4,755,872 A | 7/1988 | Esrig et al. | 5,061,192 A | 10/1991 | Chapin et al. |
| 4,755,874 A | 7/1988 | Esrig et al. | 5,061,823 A | 10/1991 | Carroll |
| 4,757,255 A | 7/1988 | Margozzi | 5,066,357 A | 11/1991 | Smyth, Jr. et al. |
| 4,764,723 A | 8/1988 | Strid | 5,069,628 A | 12/1991 | Crumly |
| 4,766,384 A | 8/1988 | Kleinberg et al. | 5,082,627 A | 1/1992 | Stanbro |
| 4,772,846 A | 9/1988 | Reeds | 5,084,671 A | 1/1992 | Miyata et al. |
| 4,780,670 A | 10/1988 | Cherry | 5,089,774 A | 2/1992 | Nakano |
| 4,783,625 A | 11/1988 | Harry et al. | 5,091,692 A | 2/1992 | Ohno et al. |
| 4,788,851 A | 12/1988 | Brault | 5,091,732 A | 2/1992 | Mileski et al. |
| 4,791,363 A | 12/1988 | Logan | 5,095,891 A | 3/1992 | Reitter |
| 4,793,814 A | 12/1988 | Zifcak et al. | 5,097,101 A | 3/1992 | Trobough |
| 4,795,962 A | 1/1989 | Yanagawa et al. | 5,097,207 A | 3/1992 | Blanz |
| 4,805,627 A | 2/1989 | Klingenbeck et al. | 5,101,453 A | 3/1992 | Rumbaugh |
| 4,810,981 A | 3/1989 | Herstein | 5,107,076 A | 4/1992 | Bullock et al. |
| 4,812,754 A | 3/1989 | Tracy et al. | 5,116,180 A | 5/1992 | Fung et al. |
| 4,818,059 A | 4/1989 | Kakii et al. | 5,126,286 A | 6/1992 | Chance |
| 4,827,211 A | 5/1989 | Strid et al. | 5,126,696 A | 6/1992 | Grote et al. |
| 4,831,494 A | 5/1989 | Arnold et al. | 5,128,612 A | 7/1992 | Aton et al. |
| 4,835,495 A | 5/1989 | Simonutti | 5,133,119 A | 7/1992 | Afshari et al. |
| 4,837,507 A | 6/1989 | Hechtman | 5,134,365 A | 7/1992 | Okubo et al. |
| 4,839,587 A | 6/1989 | Flatley et al. | 5,136,237 A | 8/1992 | Smith et al. |
| 4,849,689 A | 7/1989 | Gleason et al. | 5,138,289 A | 8/1992 | McGrath |
| 4,851,767 A | 7/1989 | Halbout et al. | 5,142,224 A | 8/1992 | Smith et al. |
| 4,853,624 A | 8/1989 | Rabjohn | 5,145,552 A | 9/1992 | Yoshizawa et al. |
| 4,853,627 A | 8/1989 | Gleason et al. | 5,148,131 A | 9/1992 | Amboss et al. |
| 4,858,160 A | 8/1989 | Strid et al. | 5,159,264 A | 10/1992 | Anderson |
| 4,859,989 A | 8/1989 | McPherson | 5,159,267 A | 10/1992 | Anderson |
| 4,864,227 A | 9/1989 | Sato | 5,159,752 A | 11/1992 | Mahant-Shetti et al. |
| 4,871,883 A | 10/1989 | Guiol | 5,160,883 A | 11/1992 | Blanz |
| 4,871,964 A | 10/1989 | Boll et al. | 5,164,319 A | 11/1992 | Hafeman et al. |
| 4,888,550 A | 12/1989 | Reid | 5,166,606 A | 11/1992 | Blanz |
| 4,891,584 A | 1/1990 | Kamieniecki et al. | 5,170,930 A | 12/1992 | Dolbear et al. |
| 4,893,914 A | 1/1990 | Hancock et al. | 5,172,049 A | 12/1992 | Kiyokawa et al. |
| 4,894,612 A | 1/1990 | Drake et al. | 5,172,050 A | 12/1992 | Swapp |
| 4,899,126 A | 2/1990 | Yamada | 5,172,051 A | 12/1992 | Zamborelli |
| 4,899,998 A | 2/1990 | Feramachi | 5,177,438 A | 1/1993 | Littlebury et al. |
| 4,901,012 A | 2/1990 | Gloanec et al. | 5,180,977 A | 1/1993 | Huff |
| 4,904,933 A | 2/1990 | Snyder et al. | 5,187,443 A | 2/1993 | Bereskin |
| 4,904,935 A | 2/1990 | Calma et al. | 5,198,752 A | 3/1993 | Miyata et al. |
| 4,906,920 A | 3/1990 | Huff et al. | 5,198,753 A | 3/1993 | Hamburgen |
| 4,908,570 A | 3/1990 | Gupta et al. | 5,202,558 A | 4/1993 | Barker |
| 4,912,399 A | 3/1990 | Greub et al. | 5,202,648 A | 4/1993 | McCandless |
| 4,916,002 A | 4/1990 | Carver | 5,207,585 A | 5/1993 | Byrnes et al. |
| 4,916,398 A | 4/1990 | Rath | 5,214,243 A | 5/1993 | Johnson |
| 4,918,373 A | 4/1990 | Newberg | 5,214,374 A | 5/1993 | St. Onge |
| 4,918,383 A | 4/1990 | Huff et al. | 5,225,037 A | 7/1993 | Elder et al. |
| 4,922,128 A | 5/1990 | Dhong et al. | 5,227,730 A | 7/1993 | King et al. |
| 4,922,186 A | 5/1990 | Tsuchiya et al. | 5,232,789 A | 8/1993 | Platz et al. |
| 4,922,912 A | 5/1990 | Watanabe | 5,233,197 A | 8/1993 | Bowman et al. |
| 4,926,172 A | 5/1990 | Gorsek | 5,233,306 A | 8/1993 | Misra |
| 4,929,893 A | 5/1990 | Sato et al. | 5,245,292 A | 9/1993 | Milesky et al. |
| 4,965,514 A | 10/1990 | Herrick | 5,266,889 A | 11/1993 | Harwood et al. |
| 4,970,386 A | 11/1990 | Buck | 5,266,963 A | 11/1993 | Carter |
| 4,972,073 A | 11/1990 | Lessing | 5,267,088 A | 11/1993 | Nomura |
| 4,975,638 A | 12/1990 | Evans et al. | 5,270,664 A | 12/1993 | McMurty et al. |
| 4,980,637 A | 12/1990 | Huff et al. | 5,274,336 A | 12/1993 | Crook et al. |
| 4,980,638 A | 12/1990 | Dermon et al. | 5,280,156 A | 1/1994 | Niori et al. |
| 4,983,910 A | 1/1991 | Majidi-Ahy et al. | 5,281,364 A | 1/1994 | Stirling et al. |
| 4,987,100 A | 1/1991 | McBride et al. | 5,289,117 A | 2/1994 | Van Loan et al. |
| 4,988,062 A | 1/1991 | London | 5,293,175 A | 3/1994 | Hemmie et al. |
| 4,991,290 A | 2/1991 | MacKay | 5,298,972 A | 3/1994 | Heffner |
| 4,998,062 A | 3/1991 | Ikeda | 5,304,924 A | 4/1994 | Yamano et al. |
| 4,998,063 A | 3/1991 | Miller | 5,308,250 A | 5/1994 | Walz |

| Patent | | Date | Inventor |
|---|---|---|---|
| 5,313,157 | A | 5/1994 | Pasiecznik, Jr. |
| 5,315,237 | A | 5/1994 | Iwakura et al. |
| 5,316,435 | A | 5/1994 | Mozingo |
| 5,317,656 | A | 5/1994 | Moslehi et al. |
| 5,321,352 | A | 6/1994 | Takebuchi |
| 5,321,453 | A | 6/1994 | Mori et al. |
| 5,326,412 | A | 7/1994 | Schreiber et al. |
| 5,334,931 | A | 8/1994 | Clarke et al. |
| 5,347,204 | A | 9/1994 | Gregory et al. |
| 5,355,079 | A | 10/1994 | Evans et al. |
| 5,357,211 | A | 10/1994 | Bryson et al. |
| 5,360,312 | A | 11/1994 | Mozingo |
| 5,361,049 | A | 11/1994 | Rubin et al. |
| 5,363,050 | A | 11/1994 | Guo et al. |
| 5,367,165 | A | 11/1994 | Toda et al. |
| 5,369,368 | A | 11/1994 | Kassen et al. |
| 5,371,654 | A | 12/1994 | Beaman et al. |
| 5,373,231 | A | 12/1994 | Boll et al. |
| 5,374,938 | A | 12/1994 | Hatazawa et al. |
| 5,376,790 | A | 12/1994 | Linker et al. |
| 5,383,787 | A | 1/1995 | Switky et al. |
| 5,389,885 | A | 2/1995 | Swart |
| 5,395,253 | A | 3/1995 | Crumly |
| 5,397,855 | A | 3/1995 | Ferlier |
| 5,404,111 | A | 4/1995 | Mori et al. |
| 5,408,188 | A | 4/1995 | Katoh |
| 5,408,189 | A | 4/1995 | Swart et al. |
| 5,412,330 | A | 5/1995 | Ravel et al. |
| 5,412,866 | A | 5/1995 | Woith et al. |
| 5,414,565 | A | 5/1995 | Sullivan et al. |
| 5,422,574 | A | 6/1995 | Kister |
| 5,430,813 | A | 7/1995 | Anderson et al. |
| 5,441,690 | A | 8/1995 | Ayala-Esquilin et al. |
| 5,451,884 | A | 9/1995 | Sauerland |
| 5,453,404 | A | 9/1995 | Leedy |
| 5,457,398 | A | 10/1995 | Schwindt et al. |
| 5,463,324 | A | 10/1995 | Wardwell et al. |
| 5,467,024 | A | 11/1995 | Swapp |
| 5,469,324 | A | 11/1995 | Henderson et al. |
| 5,471,185 | A | 11/1995 | Shea et al. |
| 5,475,316 | A | 12/1995 | Hurley et al. |
| 5,476,211 | A | 12/1995 | Khandros |
| 5,477,011 | A | 12/1995 | Singles et al. |
| 5,478,748 | A | 12/1995 | Akins, Jr. et al. |
| 5,479,108 | A | 12/1995 | Cheng |
| 5,479,109 | A | 12/1995 | Lau et al. |
| 5,481,196 | A | 1/1996 | Nosov |
| 5,481,936 | A | 1/1996 | Yanagisawa |
| 5,487,999 | A | 1/1996 | Farnworth |
| 5,488,954 | A | 2/1996 | Sleva et al. |
| 5,491,425 | A | 2/1996 | Watanabe et al. |
| 5,493,070 | A | 2/1996 | Habu |
| 5,493,236 | A | 2/1996 | Ishii et al. |
| 5,500,606 | A | 3/1996 | Holmes |
| 5,505,150 | A | 4/1996 | James et al. |
| 5,506,498 | A | 4/1996 | Anderson et al. |
| 5,506,515 | A * | 4/1996 | Godshalk et al. ............ 324/762 |
| 5,507,652 | A | 4/1996 | Wardwell |
| 5,510,792 | A | 4/1996 | Ono et al. |
| 5,511,010 | A | 4/1996 | Burns |
| 5,512,835 | A | 4/1996 | Rivera et al. |
| 5,517,126 | A | 5/1996 | Yamaguchi |
| 5,521,518 | A | 5/1996 | Higgins |
| 5,521,522 | A | 5/1996 | Abe et al. |
| 5,523,694 | A | 6/1996 | Cole, Jr. |
| 5,528,158 | A | 6/1996 | Sinsheimer et al. |
| 5,530,372 | A | 6/1996 | Lee et al. |
| 5,531,022 | A | 7/1996 | Beaman et al. |
| 5,532,608 | A | 7/1996 | Behfar-Rad et al. |
| 5,537,372 | A | 7/1996 | Albrecht et al. |
| 5,539,323 | A | 7/1996 | Davis, Jr. |
| 5,539,676 | A | 7/1996 | Yamaguchi |
| 5,550,481 | A | 8/1996 | Holmes et al. |
| 5,561,378 | A | 10/1996 | Bockelman et al. |
| 5,565,788 | A | 10/1996 | Burr et al. |
| 5,565,881 | A | 10/1996 | Phillips et al. |
| 5,569,591 | A | 10/1996 | Kell et al. |
| 5,571,324 | A | 11/1996 | Sago et al. |
| 5,578,932 | A | 11/1996 | Adamian |
| 5,583,445 | A | 12/1996 | Mullen |
| 5,584,120 | A | 12/1996 | Roberts |
| 5,584,608 | A | 12/1996 | Gillespie |
| 5,589,781 | A | 12/1996 | Higgens et al. |
| 5,594,358 | A | 1/1997 | Ishikawa et al. |
| 5,600,256 | A | 2/1997 | Woith et al. |
| 5,601,740 | A | 2/1997 | Eldridge et al. |
| 5,610,529 | A | 3/1997 | Schwindt |
| 5,611,008 | A | 3/1997 | Yap |
| 5,617,035 | A | 4/1997 | Swapp |
| 5,621,333 | A | 4/1997 | Long et al. |
| 5,621,400 | A | 4/1997 | Corbi |
| 5,623,213 | A | 4/1997 | Liu et al. |
| 5,623,214 | A | 4/1997 | Pasiecznik, Jr. |
| 5,627,473 | A | 5/1997 | Takami |
| 5,628,057 | A | 5/1997 | Phillips et al. |
| 5,629,838 | A | 5/1997 | Knight et al. |
| 5,631,571 | A | 5/1997 | Spaziani et al. |
| 5,633,780 | A | 5/1997 | Cronin |
| 5,635,846 | A | 6/1997 | Beaman et al. |
| 5,642,298 | A | 6/1997 | Mallory et al. |
| 5,644,248 | A | 7/1997 | Fujimoto |
| 5,653,939 | A | 8/1997 | Hollis et al. |
| 5,656,942 | A | 8/1997 | Watts et al. |
| 5,659,421 | A | 8/1997 | Rahmel et al. |
| 5,666,063 | A | 9/1997 | Abercrombie et al. |
| 5,669,316 | A | 9/1997 | Faz et al. |
| 5,670,322 | A | 9/1997 | Eggers et al. |
| 5,670,888 | A | 9/1997 | Cheng |
| 5,672,816 | A | 9/1997 | Park et al. |
| 5,675,499 | A | 10/1997 | Lee et al. |
| 5,675,932 | A | 10/1997 | Mauney |
| 5,676,360 | A | 10/1997 | Boucher et al. |
| 5,678,210 | A | 10/1997 | Hannah |
| 5,685,232 | A | 11/1997 | Inoue |
| 5,686,317 | A | 11/1997 | Akram et al. |
| 5,686,960 | A | 11/1997 | Sussman et al. |
| 5,688,618 | A | 11/1997 | Hulderman et al. |
| 5,700,844 | A | 12/1997 | Hederick et al. |
| 5,704,355 | A | 1/1998 | Bridges |
| 5,715,819 | A | 2/1998 | Svenson et al. |
| 5,720,098 | A | 2/1998 | Kister |
| 5,723,347 | A | 3/1998 | Kirano et al. |
| 5,726,211 | A | 3/1998 | Hedrick et al. |
| 5,728,091 | A | 3/1998 | Payne et al. |
| 5,729,150 | A | 3/1998 | Schwindt |
| 5,731,920 | A | 3/1998 | Katsuragawa |
| 5,742,174 | A | 4/1998 | Kister et al. |
| 5,744,971 | A | 4/1998 | Chan et al. |
| 5,748,506 | A | 5/1998 | Bockelman |
| 5,751,153 | A | 5/1998 | Bockelman |
| 5,751,252 | A | 5/1998 | Phillips |
| 5,756,021 | A | 5/1998 | Bedrick et al. |
| 5,756,908 | A | 5/1998 | Knollmeyer et al. |
| 5,764,070 | A | 6/1998 | Pedder |
| 5,767,690 | A | 6/1998 | Fujimoto |
| 5,772,451 | A | 6/1998 | Dozier, II et al. |
| 5,773,780 | A | 6/1998 | Eldridge et al. |
| 5,777,485 | A | 7/1998 | Tanaka et al. |
| 5,785,538 | A | 7/1998 | Beaman et al. |
| 5,792,668 | A | 8/1998 | Fuller et al. |
| 5,793,213 | A | 8/1998 | Bockelman et al. |
| 5,794,133 | A | 8/1998 | Kashima |
| 5,803,607 | A | 9/1998 | Jones et al. |
| 5,804,483 | A | 9/1998 | Nakajima et al. |
| 5,804,607 | A | 9/1998 | Hedrick et al. |
| 5,804,982 | A | 9/1998 | Lo et al. |

| Patent | Date | Inventor |
|---|---|---|
| 5,804,983 A | 9/1998 | Nakajima et al. |
| 5,806,181 A | 9/1998 | Khandros et al. |
| 5,807,107 A | 9/1998 | Bright et al. |
| 5,808,874 A | 9/1998 | Smith |
| 5,810,607 A | 9/1998 | Shih et al. |
| 5,811,751 A | 9/1998 | Leona et al. |
| 5,811,982 A | 9/1998 | Beaman et al. |
| 5,813,847 A | 9/1998 | Eroglu et al. |
| 5,814,847 A | 9/1998 | Shihadeh et al. |
| 5,820,014 A | 10/1998 | Dozier, II et al. |
| 5,821,763 A | 10/1998 | Beaman et al. |
| 5,824,494 A | 10/1998 | Feldberg |
| 5,829,128 A | 11/1998 | Eldridge et al. |
| 5,829,437 A | 11/1998 | Bridges |
| 5,831,442 A | 11/1998 | Heigl |
| 5,832,601 A | 11/1998 | Eldridge et al. |
| 5,833,601 A | 11/1998 | Swartz et al. |
| 5,838,160 A | 11/1998 | Beaman et al. |
| 5,841,288 A | 11/1998 | Meaney et al. |
| 5,841,342 A | 11/1998 | Hegmann et al. |
| 5,846,708 A | 12/1998 | Hollis et al. |
| 5,847,569 A | 12/1998 | Ho et al. |
| 5,848,500 A | 12/1998 | Kirk |
| 5,852,232 A | 12/1998 | Samsavar et al. |
| 5,852,871 A | 12/1998 | Khandros |
| 5,854,608 A | 12/1998 | Leisten |
| 5,864,946 A | 2/1999 | Eldridge et al. |
| 5,867,073 A | 2/1999 | Weinreb et al. |
| 5,869,326 A | 2/1999 | Hofmann |
| 5,869,974 A | 2/1999 | Akram et al. |
| 5,874,361 A | 2/1999 | Collins et al. |
| 5,876,082 A | 3/1999 | Kempf et al. |
| 5,877,452 A * | 3/1999 | McConnell ............... 174/88 C |
| 5,878,486 A | 3/1999 | Eldridge et al. |
| 5,879,289 A | 3/1999 | Yarush et al. |
| 5,883,522 A | 3/1999 | O'Boyle |
| 5,883,523 A | 3/1999 | Ferland et al. |
| 5,884,398 A | 3/1999 | Eldridge et al. |
| 5,888,075 A | 3/1999 | Hasegawa et al. |
| 5,892,539 A | 4/1999 | Colvin |
| 5,896,038 A | 4/1999 | Budnaitis et al. |
| 5,900,737 A | 5/1999 | Graham et al. |
| 5,900,738 A | 5/1999 | Khandros et al. |
| 5,903,143 A | 5/1999 | Mochizuki et al. |
| 5,905,421 A | 5/1999 | Oldfield |
| 5,910,727 A | 6/1999 | Fujihara et al. |
| 5,912,046 A | 6/1999 | Eldridge et al. |
| 5,914,613 A | 6/1999 | Gleason et al. |
| 5,914,614 A | 6/1999 | Beaman et al. |
| 5,916,689 A | 6/1999 | Collins et al. |
| 5,917,707 A | 6/1999 | Khandros et al. |
| 5,923,180 A | 7/1999 | Botka et al. |
| 5,926,029 A | 7/1999 | Ference et al. |
| 5,926,951 A | 7/1999 | Khandros et al. |
| 5,940,965 A | 8/1999 | Uhling et al. |
| 5,944,093 A | 8/1999 | Viswanath |
| 5,945,836 A | 8/1999 | Sayre et al. |
| 5,949,383 A | 9/1999 | Hayes et al. |
| 5,949,579 A | 9/1999 | Baker |
| 5,959,461 A | 9/1999 | Brown et al. |
| 5,963,364 A | 10/1999 | Leong et al. |
| 5,966,645 A | 10/1999 | Davis |
| 5,970,429 A | 10/1999 | Martin |
| 5,973,504 A | 10/1999 | Chong |
| 5,974,662 A | 11/1999 | Eldridge et al. |
| 5,977,783 A | 11/1999 | Takayama et al. |
| 5,981,268 A | 11/1999 | Kovacs et al. |
| 5,982,166 A | 11/1999 | Mautz |
| 5,983,493 A | 11/1999 | Eldridge et al. |
| 5,993,611 A | 11/1999 | Moroney, III et al. |
| 5,994,152 A | 11/1999 | Khandros et al. |
| 5,995,914 A | 11/1999 | Cabot |
| 5,996,102 A | 11/1999 | Haulin |
| 5,998,228 A | 12/1999 | Eldridge et al. |
| 5,998,768 A | 12/1999 | Hunter et al. |
| 5,998,864 A | 12/1999 | Khandros et al. |
| 5,999,268 A | 12/1999 | Yonezawa et al. |
| 6,001,760 A | 12/1999 | Katsuda et al. |
| 6,002,426 A | 12/1999 | Back et al. |
| 6,006,002 A | 12/1999 | Motok et al. |
| 6,013,586 A | 1/2000 | McGhee et al. |
| 6,019,612 A | 2/2000 | Hasegawa et al. |
| 6,023,103 A | 2/2000 | Chang et al. |
| 6,028,435 A | 2/2000 | Nikawa |
| 6,029,344 A | 2/2000 | Khandros et al. |
| 6,031,383 A | 2/2000 | Streib et al. |
| 6,031,384 A | 2/2000 | Streib et al. |
| 6,032,356 A | 3/2000 | Eldridge et al. |
| 6,032,714 A | 3/2000 | Fenton |
| 6,033,935 A | 3/2000 | Dozier, II et al. |
| 6,034,533 A | 3/2000 | Tervo et al. |
| 6,037,785 A | 3/2000 | Higgins |
| 6,040,739 A | 3/2000 | Wedeen et al. |
| 6,042,712 A | 3/2000 | Mathieu |
| 6,043,563 A | 3/2000 | Eldridge et al. |
| 6,046,599 A | 4/2000 | Long et al. |
| 6,049,216 A | 4/2000 | Yang et al. |
| 6,049,976 A | 4/2000 | Khandros |
| 6,050,829 A | 4/2000 | Eldridge et al. |
| 6,051,422 A | 4/2000 | Kovacs et al. |
| 6,052,653 A | 4/2000 | Mazur et al. |
| 6,054,651 A | 4/2000 | Fogel et al. |
| 6,054,869 A | 4/2000 | Hutton et al. |
| 6,059,982 A | 5/2000 | Palagonia et al. |
| 6,060,888 A | 5/2000 | Blackham et al. |
| 6,060,892 A | 5/2000 | Yamagata |
| 6,061,589 A | 5/2000 | Bridges et al. |
| 6,062,879 A | 5/2000 | Beaman et al. |
| 6,064,213 A | 5/2000 | Khandros et al. |
| 6,064,217 A | 5/2000 | Smith |
| 6,064,218 A | 5/2000 | Godfrey et al. |
| 6,066,911 A | 5/2000 | Lindemann et al. |
| 6,071,009 A | 6/2000 | Clyne |
| 6,078,183 A | 6/2000 | Cole, Jr. |
| 6,078,500 A | 6/2000 | Beaman et al. |
| 6,090,261 A | 7/2000 | Mathieu |
| 6,091,236 A | 7/2000 | Piety et al. |
| 6,091,255 A | 7/2000 | Godfrey |
| 6,091,256 A | 7/2000 | Long et al. |
| 6,096,561 A | 8/2000 | Kaplan et al. |
| 6,096,567 A | 8/2000 | Kaplan et al. |
| 6,100,815 A | 8/2000 | Pailthorp |
| 6,104,201 A | 8/2000 | Beaman et al. |
| 6,104,206 A | 8/2000 | Verkull |
| 6,110,823 A | 8/2000 | Eldridge et al. |
| 6,114,864 A | 9/2000 | Soejima et al. |
| 6,114,865 A | 9/2000 | Lagowski et al. |
| 6,118,287 A | 9/2000 | Boll et al. |
| 6,118,894 A | 9/2000 | Schwartz et al. |
| 6,121,836 A | 9/2000 | Vallencourt |
| 6,124,725 A | 9/2000 | Sato |
| 6,127,831 A | 10/2000 | Khoury et al. |
| 6,130,536 A | 10/2000 | Powell et al. |
| 6,137,302 A | 10/2000 | Schwindt |
| 6,144,212 A | 11/2000 | Mizuta |
| 6,146,908 A | 11/2000 | Falque et al. |
| 6,147,502 A | 11/2000 | Fryer et al. |
| 6,147,851 A | 11/2000 | Anderson |
| 6,150,186 A | 11/2000 | Chen et al. |
| 6,160,407 A | 12/2000 | Nikawa |
| 6,166,553 A | 12/2000 | Sinsheimer |
| 6,168,974 B1 | 1/2001 | Chang et al. |
| 6,169,410 B1 | 1/2001 | Grace et al. |
| 6,172,337 B1 | 1/2001 | Johnsgard et al. |
| 6,174,744 B1 | 1/2001 | Watanabe et al. |
| 6,175,228 B1 | 1/2001 | Zamborelli et al. |

| | | |
|---|---|---|
| 6,181,144 B1 | 1/2001 | Hembree et al. |
| 6,181,149 B1 | 1/2001 | Godfrey et al. |
| 6,181,297 B1 | 1/2001 | Leisten |
| 6,181,416 B1 | 1/2001 | Falk |
| 6,184,053 B1 | 2/2001 | Eldridge et al. |
| 6,184,587 B1 | 2/2001 | Khandros et al. |
| 6,184,845 B1 | 2/2001 | Leisten et al. |
| 6,191,596 B1 | 2/2001 | Abiko |
| 6,194,720 B1 | 2/2001 | Li et al. |
| 6,201,453 B1 | 3/2001 | Chan et al. |
| 6,206,273 B1 | 3/2001 | Beaman et al. |
| 6,208,225 B1 | 3/2001 | Miller |
| RE37,130 E | 4/2001 | Fiori, Jr. |
| 6,211,663 B1 | 4/2001 | Moulthrop et al. |
| 6,211,837 B1 | 4/2001 | Crouch et al. |
| 6,215,196 B1 | 4/2001 | Eldridge et al. |
| 6,215,295 B1 | 4/2001 | Smith, III |
| 6,215,670 B1 | 4/2001 | Khandros |
| 6,218,910 B1 | 4/2001 | Miller |
| 6,222,031 B1 | 4/2001 | Wakabayashi et al. |
| 6,222,970 B1 | 4/2001 | Wach et al. |
| 6,229,327 B1 | 5/2001 | Boll et al. |
| 6,232,149 B1 | 5/2001 | Dozier, II et al. |
| 6,232,787 B1 | 5/2001 | Lo et al. |
| 6,232,788 B1 | 5/2001 | Schwindt et al. |
| 6,232,789 B1 | 5/2001 | Schwindt |
| 6,233,613 B1 | 5/2001 | Walker et al. |
| 6,236,223 B1 | 5/2001 | Brady et al. |
| 6,242,803 B1 | 6/2001 | Khandros et al. |
| 6,242,929 B1 | 6/2001 | Mizuta |
| 6,245,692 B1 | 6/2001 | Pearce et al. |
| 6,246,247 B1 | 6/2001 | Eldridge et al. |
| 6,251,595 B1 | 6/2001 | Gordon et al. |
| 6,255,126 B1 | 7/2001 | Mathiue et al. |
| 6,256,882 B1 | 7/2001 | Gleason et al. |
| 6,257,564 B1 | 7/2001 | Avneri et al. |
| 6,257,565 B1 | 7/2001 | Avneri et al. |
| 6,259,260 B1 | 7/2001 | Smith et al. |
| 6,265,950 B1 | 7/2001 | Schmidt et al. |
| 6,268,015 B1 | 7/2001 | Mathieu et al. |
| 6,268,016 B1 | 7/2001 | Bhatt et al. |
| 6,271,673 B1 | 8/2001 | Furuta et al. |
| 6,274,823 B1 | 8/2001 | Khandros et al. |
| 6,275,043 B1 | 8/2001 | Muhlberger et al. |
| 6,275,738 B1 | 8/2001 | Kasevich et al. |
| 6,278,051 B1 | 8/2001 | Peabody |
| 6,278,411 B1 | 8/2001 | Ohlsson et al. |
| 6,281,691 B1 | 8/2001 | Matsunaga et al. |
| 6,286,208 B1 | 9/2001 | Shih et al. |
| 6,292,760 B1 | 9/2001 | Burns |
| 6,295,729 B1 | 10/2001 | Beaman et al. |
| 6,300,775 B1 | 10/2001 | Peach et al. |
| 6,300,780 B1 | 10/2001 | Beaman et al. |
| 6,307,161 B1 | 10/2001 | Grube et al. |
| 6,307,363 B1 | 10/2001 | Anderson |
| 6,307,672 B1 | 10/2001 | DeNure |
| 6,310,483 B1 | 10/2001 | Taura et al. |
| 6,320,372 B1 | 11/2001 | Keller |
| 6,320,396 B1 | 11/2001 | Nikawa |
| 6,327,034 B1 | 12/2001 | Hoover et al. |
| 6,329,827 B1 | 12/2001 | Beaman et al. |
| 6,330,164 B1 | 12/2001 | Khandros et al. |
| 6,332,270 B2 | 12/2001 | Beaman et al. |
| 6,334,247 B1 | 1/2002 | Beaman et al. |
| 6,335,625 B1 | 1/2002 | Bryant et al. |
| 6,339,338 B1 | 1/2002 | Eldridge et al. |
| 6,340,568 B2 | 1/2002 | Hefti |
| 6,340,895 B1 | 1/2002 | Uher et al. |
| 6,351,885 B2 | 3/2002 | Suzuki et al. |
| 6,352,454 B1 | 3/2002 | Kim et al. |
| 6,359,456 B1 | 3/2002 | Hembree et al. |
| 6,362,792 B1 | 3/2002 | Sawamura et al. |
| 6,366,247 B1 | 4/2002 | Sawamura et al. |
| 6,369,776 B1 | 4/2002 | Leisten et al. |
| 6,376,258 B2 | 4/2002 | Hefti |
| 6,384,614 B1 | 5/2002 | Hager et al. |
| 6,384,615 B2 | 5/2002 | Schwindt |
| 6,388,455 B1 | 5/2002 | Kamieniecki et al. |
| 6,395,480 B1 | 5/2002 | Hefti |
| 6,396,296 B1 | 5/2002 | Tarter et al. |
| 6,396,298 B1 | 5/2002 | Young et al. |
| 6,400,168 B2 | 6/2002 | Matsunaga et al. |
| 6,404,213 B2 | 6/2002 | Noda |
| 6,407,542 B1 | 6/2002 | Conte |
| 6,407,562 B1 | 6/2002 | Whiteman |
| 6,409,724 B1 | 6/2002 | Penny et al. |
| 6,414,478 B1 | 7/2002 | Suzuki |
| 6,415,858 B1 | 7/2002 | Getchel et al. |
| 6,418,009 B1 | 7/2002 | Brunette |
| 6,420,722 B2 | 7/2002 | Moore et al. |
| 6,424,316 B1 | 7/2002 | Leisten et al. |
| 6,429,029 B1 | 8/2002 | Eldridge et al. |
| 6,441,315 B1 | 8/2002 | Eldridge et al. |
| 6,442,831 B1 | 9/2002 | Khandros et al. |
| 6,447,339 B1 | 9/2002 | Reed et al. |
| 6,448,788 B1 | 9/2002 | Meaney et al. |
| 6,448,865 B1 | 9/2002 | Miller |
| 6,452,406 B1 | 9/2002 | Beaman et al. |
| 6,452,411 B1 | 9/2002 | Miller et al. |
| 6,456,099 B1 | 9/2002 | Eldridge et al. |
| 6,456,103 B1 | 9/2002 | Eldridge et al. |
| 6,459,343 B1 | 10/2002 | Miller |
| 6,459,739 B1 | 10/2002 | Vitenberg |
| 6,468,098 B1 | 10/2002 | Eldridge |
| 6,475,822 B2 | 11/2002 | Eldridge |
| 6,476,333 B1 | 11/2002 | Khandros et al. |
| 6,476,442 B1 | 11/2002 | Williams et al. |
| 6,476,630 B1 | 11/2002 | Whitten et al. |
| 6,479,308 B1 | 11/2002 | Eldridge |
| 6,480,013 B1 | 11/2002 | Nayler et al. |
| 6,480,978 B1 | 11/2002 | Roy et al. |
| 6,481,939 B1 | 11/2002 | Gillespie et al. |
| 6,482,013 B2 | 11/2002 | Eldridge et al. |
| 6,483,327 B1 | 11/2002 | Bruce et al. |
| 6,488,405 B1 | 12/2002 | Eppes et al. |
| 6,490,471 B2 | 12/2002 | Svenson et al. |
| 6,491,968 B1 | 12/2002 | Mathieu et al. |
| 6,496,024 B2 | 12/2002 | Schwindt |
| 6,499,121 B1 | 12/2002 | Roy et al. |
| 6,501,343 B2 | 12/2002 | Miller |
| 6,509,751 B1 | 1/2003 | Mathieu et al. |
| 6,512,482 B1 | 1/2003 | Nelson et al. |
| 6,520,778 B1 | 2/2003 | Eldridge et al. |
| 6,525,555 B1 | 2/2003 | Khandros et al. |
| 6,526,655 B2 | 3/2003 | Beaman et al. |
| 6,528,984 B2 | 3/2003 | Beaman et al. |
| 6,528,993 B1 | 3/2003 | Shin et al. |
| 6,529,844 B1 | 3/2003 | Kapetanic et al. |
| 6,534,856 B1 | 3/2003 | Dozier, II et al. |
| 6,538,214 B2 | 3/2003 | Khandros |
| 6,538,538 B2 | 3/2003 | Hreish et al. |
| 6,539,531 B2 | 3/2003 | Miller et al. |
| 6,548,311 B1 | 4/2003 | Knoll |
| 6,549,022 B1 | 4/2003 | Cole, Jr. et al. |
| 6,549,106 B2 | 4/2003 | Martin |
| 6,551,884 B2 | 4/2003 | Masuoka |
| 6,559,671 B2 | 5/2003 | Miller et al. |
| 6,566,079 B2 | 5/2003 | Hefti |
| 6,572,608 B1 | 6/2003 | Lee et al. |
| 6,573,702 B2 | 6/2003 | Marcuse et al. |
| 6,578,264 B1 | 6/2003 | Gleason et al. |
| 6,580,283 B1 | 6/2003 | Carbone et al. |
| 6,582,979 B2 | 6/2003 | Coccioli et al. |
| 6,587,327 B1 | 7/2003 | Devoe et al. |
| 6,597,187 B2 | 7/2003 | Eldridge et al. |
| 6,603,322 B1 | 8/2003 | Boll et al. |

| | | | | | | |
|---|---|---|---|---|---|---|
| 6,603,323 B1 | 8/2003 | Miller et al. | 6,759,859 B2 | 7/2004 | Deng et al. | |
| 6,603,324 B2 | 8/2003 | Eldridge et al. | 6,764,869 B2 | 7/2004 | Eldridge et al. | |
| 6,605,941 B2 | 8/2003 | Abe | 6,768,328 B2 | 7/2004 | Self et al. | |
| 6,605,951 B1 | 8/2003 | Cowan | 6,770,955 B1 | 8/2004 | Coccioli et al. | |
| 6,605,955 B1 | 8/2003 | Costello et al. | 6,771,806 B1 | 8/2004 | Satya et al. | |
| 6,606,014 B2 | 8/2003 | Miller | 6,777,319 B2 | 8/2004 | Grube et al. | |
| 6,606,575 B2 | 8/2003 | Miller | 6,778,140 B1 | 8/2004 | Yeh | |
| 6,608,494 B1 | 8/2003 | Bruce et al. | 6,778,406 B2 | 8/2004 | Eldridge et al. | |
| 6,611,417 B2 | 8/2003 | Chen | 6,780,001 B2 | 8/2004 | Eldridge et al. | |
| 6,615,485 B2 | 9/2003 | Eldridge et al. | 6,784,674 B2 | 8/2004 | Miller | |
| 6,616,966 B2 | 9/2003 | Mathieu et al. | 6,784,677 B2 | 8/2004 | Miller | |
| 6,617,862 B1 | 9/2003 | Bruce | 6,784,679 B2 | 8/2004 | Sweet et al. | |
| 6,617,866 B1 | 9/2003 | Ickes | 6,788,093 B2 | 9/2004 | Aitren et al. | |
| 6,621,082 B2 | 9/2003 | Morita et al. | 6,788,094 B2 | 9/2004 | Khandros et al. | |
| 6,621,260 B2 | 9/2003 | Eldridge et al. | 6,791,176 B2 | 9/2004 | Mathieu et al. | |
| 6,622,103 B1 | 9/2003 | Miller | 6,794,888 B2 | 9/2004 | Kawaguchi et al. | |
| 6,624,648 B2 | 9/2003 | Eldridge et al. | 6,794,934 B2 | 9/2004 | Betti-Berutto et al. | |
| 6,627,461 B2 | 9/2003 | Chapman et al. | 6,794,950 B2 | 9/2004 | Du Toit et al. | |
| 6,627,483 B2 | 9/2003 | Ondricek et al. | 6,798,225 B2 | 9/2004 | Miller | |
| 6,627,980 B2 | 9/2003 | Eldridge | 6,798,226 B2 | 9/2004 | Altmann et al. | |
| 6,628,503 B2 | 9/2003 | Sogard | 6,806,724 B2 * | 10/2004 | Hayden et al. | 324/754 |
| 6,628,980 B2 | 9/2003 | Atalar et al. | 6,806,836 B2 | 10/2004 | Ogawa et al. | |
| 6,633,174 B1 | 10/2003 | Satya et al. | 6,807,734 B2 | 10/2004 | Eldridge et al. | |
| 6,636,182 B2 | 10/2003 | Mehltretter | 6,809,533 B1 | 10/2004 | Anlage et al. | |
| 6,639,461 B1 | 10/2003 | Tam et al. | 6,811,406 B2 | 11/2004 | Grube | |
| 6,640,415 B2 | 11/2003 | Eslamy et al. | 6,812,691 B2 | 11/2004 | Miller | |
| 6,640,432 B1 | 11/2003 | Mathieu et al. | 6,812,718 B1 | 11/2004 | Chong et al. | |
| 6,642,625 B2 | 11/2003 | Dozier, II et al. | 6,815,963 B2 | 11/2004 | Gleason et al. | |
| 6,643,597 B1 | 11/2003 | Dunsmore | 6,816,031 B1 | 11/2004 | Miller | |
| 6,644,982 B1 | 11/2003 | Ondricek et al. | 6,816,840 B1 | 11/2004 | Goodwin, III | |
| 6,646,520 B2 | 11/2003 | Miller | 6,817,052 B2 | 11/2004 | Grube | |
| 6,653,903 B2 | 11/2003 | Leich et al. | 6,818,840 B2 | 11/2004 | Khandros | |
| 6,655,023 B1 | 12/2003 | Eldridge et al. | 6,822,463 B1 | 11/2004 | Jacobs | |
| 6,657,455 B2 | 12/2003 | Eldridge et al. | 6,822,529 B2 | 11/2004 | Miller | |
| 6,657,601 B2 | 12/2003 | McLean | 6,825,052 B2 | 11/2004 | Eldridge et al. | |
| 6,661,316 B2 | 12/2003 | Hreish et al. | 6,825,422 B2 | 11/2004 | Eldridge et al. | |
| 6,664,628 B2 | 12/2003 | Khandros et al. | 6,827,582 B2 | 12/2004 | Mathieu et al. | |
| 6,669,489 B1 | 12/2003 | Dozier, II et al. | 6,827,584 B2 | 12/2004 | Mathieu et al. | |
| 6,672,875 B1 | 1/2004 | Mathieu et al. | 6,835,898 B2 | 12/2004 | Eldridge et al. | |
| 6,677,744 B1 | 1/2004 | Long | 6,836,962 B2 | 1/2005 | Khandros et al. | |
| 6,678,850 B2 | 1/2004 | Roy et al. | 6,838,885 B2 | 1/2005 | Kamitani | |
| 6,678,876 B2 | 1/2004 | Stevens et al. | 6,838,893 B2 | 1/2005 | Khandros et al. | |
| 6,680,659 B2 | 1/2004 | Miller | 6,839,964 B2 | 1/2005 | Henson | |
| 6,685,817 B1 | 2/2004 | Mathieu | 6,845,491 B2 | 1/2005 | Miller et al. | |
| 6,686,754 B2 | 2/2004 | Miller | 6,850,082 B2 | 2/2005 | Schwindt | |
| 6,690,185 B1 | 2/2004 | Khandros et al. | 6,856,129 B2 | 2/2005 | Thomas et al. | |
| 6,701,265 B2 | 3/2004 | Hill et al. | 6,856,150 B2 | 2/2005 | Sporck et al. | |
| 6,701,612 B2 | 3/2004 | Khandros et al. | 6,862,727 B2 | 3/2005 | Stevens | |
| 6,707,548 B2 | 3/2004 | Kreimer et al. | 6,864,105 B2 | 3/2005 | Grube et al. | |
| 6,708,403 B2 | 3/2004 | Beaman et al. | 6,864,694 B2 | 3/2005 | McTigue | |
| 6,710,265 B2 | 3/2004 | Hill et al. | 6,870,359 B1 | 3/2005 | Sekel | |
| 6,710,798 B1 | 3/2004 | Hershel et al. | 6,870,381 B2 | 3/2005 | Grube | |
| 6,713,374 B2 | 3/2004 | Eldridge et al. | 6,882,239 B2 | 4/2005 | Miller | |
| 6,714,828 B2 | 3/2004 | Eldridge et al. | 6,882,546 B2 | 4/2005 | Miller | |
| 6,717,426 B2 | 4/2004 | Iwasaki | 6,887,723 B1 | 5/2005 | Ondricek et al. | |
| 6,720,501 B1 | 4/2004 | Henson | 6,888,362 B2 | 5/2005 | Eldridge et al. | |
| 6,722,032 B2 | 4/2004 | Beaman et al. | 6,891,385 B2 | 5/2005 | Miller | |
| 6,724,205 B1 | 4/2004 | Hayden et al. | 6,900,646 B2 | 5/2005 | Kasukabe et al. | |
| 6,724,928 B1 | 4/2004 | Davis | 6,900,647 B2 | 5/2005 | Yoshida et al. | |
| 6,727,579 B1 | 4/2004 | Eldridge et al. | 6,900,652 B2 | 5/2005 | Mazur | |
| 6,727,580 B1 | 4/2004 | Eldridge et al. | 6,900,653 B2 | 5/2005 | Yu et al. | |
| 6,727,716 B1 | 4/2004 | Sharif | 6,902,416 B2 | 6/2005 | Feldman | |
| 6,729,019 B2 | 5/2004 | Grube et al. | 6,902,941 B2 | 6/2005 | Sun | |
| 6,731,804 B1 | 5/2004 | Carrieri et al. | 6,903,563 B2 | 6/2005 | Yoshida et al. | |
| 6,734,687 B1 | 5/2004 | Ishitani et al. | 6,906,506 B1 | 6/2005 | Reano et al. | |
| 6,737,920 B2 | 5/2004 | Jen et al. | 6,906,539 B2 | 6/2005 | Wilson et al. | |
| 6,741,085 B1 | 5/2004 | Khandros et al. | 6,906,542 B2 | 6/2005 | Sakagawa et al. | |
| 6,741,092 B2 | 5/2004 | Eldridge et al. | 6,906,543 B2 | 6/2005 | Lou et al. | |
| 6,741,129 B1 | 5/2004 | Corsi et al. | 6,907,149 B2 | 6/2005 | Slater | |
| 6,744,268 B2 | 6/2004 | Hollman | 6,908,364 B2 | 6/2005 | Back et al. | |
| 6,753,679 B1 | 6/2004 | Kwong et al. | 6,909,297 B2 | 6/2005 | Ji et al. | |
| 6,753,699 B2 | 6/2004 | Stockstad | 6,909,300 B2 | 6/2005 | Lu et al. | |
| 6,759,311 B2 | 7/2004 | Eldridge et al. | 6,909,983 B2 | 6/2005 | Sutherland | |

| | | | | | | |
|---|---|---|---|---|---|---|
| 6,910,268 B2 | 6/2005 | Miller | | 7,015,707 B2 | 3/2006 | Cherian |
| 6,911,814 B2 | 6/2005 | Miller et al. | | 7,015,708 B2 | 3/2006 | Beckous et al. |
| 6,911,826 B2 | 6/2005 | Plotnikov et al. | | 7,015,709 B2 | 3/2006 | Capps et al. |
| 6,911,834 B2 | 6/2005 | Mitchell et al. | | 7,015,710 B2 | 3/2006 | Yoshida et al. |
| 6,911,835 B2 | 6/2005 | Chraft et al. | | 7,015,711 B2 | 3/2006 | Rothaug et al. |
| 6,912,468 B2 | 6/2005 | Marin et al. | | 7,019,541 B2 | 3/2006 | Kittrell |
| 6,913,468 B2 | 7/2005 | Dozier, II et al. | | 7,019,544 B1 | 3/2006 | Jacobs et al. |
| 6,914,244 B2 | 7/2005 | Alani | | 7,019,701 B2 | 3/2006 | Ohno et al. |
| 6,914,427 B2 | 7/2005 | Gifford et al. | | 7,020,360 B2 | 3/2006 | Satomura et al. |
| 6,914,430 B2 | 7/2005 | Hasegawa et al. | | 7,020,363 B2 | 3/2006 | Johannessen |
| 6,914,580 B2 | 7/2005 | Leisten | | 7,022,976 B1 | 4/2006 | Santana, Jr. et al. |
| 6,917,195 B2 | 7/2005 | Hollman | | 7,022,985 B2 | 4/2006 | Knebel et al. |
| 6,917,210 B2 | 7/2005 | Miller | | 7,023,225 B2 | 4/2006 | Blackwood |
| 6,917,211 B2 | 7/2005 | Yoshida et al. | | 7,023,226 B2 | 4/2006 | Okumura et al. |
| 6,917,525 B2 | 7/2005 | Mok et al. | | 7,023,231 B2 | 4/2006 | Howland, Jr. et al. |
| 6,919,732 B2 | 7/2005 | Yoshida et al. | | 7,025,628 B2 | 4/2006 | LaMeres et al. |
| 6,922,069 B2 | 7/2005 | Jun | | 7,026,832 B2 | 4/2006 | Chaya et al. |
| 6,924,653 B2 | 8/2005 | Schaeffer et al. | | 7,026,833 B2 | 4/2006 | Rincon et al. |
| 6,924,655 B2 | 8/2005 | Kirby | | 7,026,834 B2 | 4/2006 | Hwang |
| 6,927,078 B2 | 8/2005 | Saijo et al. | | 7,026,835 B2 | 4/2006 | Farnworth et al. |
| 6,927,079 B1 | 8/2005 | Fyfield | | 7,030,328 B1 | 4/2006 | Beerling |
| 6,927,586 B2 | 8/2005 | Thiessen | | 7,030,599 B2 | 4/2006 | Douglas |
| 6,927,587 B2 | 8/2005 | Yoshioka | | 7,030,827 B2 | 4/2006 | Mahler et al. |
| 6,927,598 B2 | 8/2005 | Lee et al. | | 7,032,307 B2 | 4/2006 | Matsunaga et al. |
| 6,930,498 B2 | 8/2005 | Tervo et al. | | 7,034,553 B2 | 4/2006 | Gilboe |
| 6,933,713 B2 | 8/2005 | Cannon | | 7,035,738 B2 | 4/2006 | Matsumoto et al. |
| 6,933,717 B1 | 8/2005 | Dogaru et al. | | 7,057,404 B2 | 6/2006 | Gleason et al. |
| 6,933,725 B2 | 8/2005 | Lim et al. | | 7,071,722 B2 | 7/2006 | Yamada et al. |
| 6,933,736 B2 | 8/2005 | Kobayashi et al. | | 7,088,981 B2 | 8/2006 | Chang |
| 6,933,737 B2 | 8/2005 | Sugawara | | 7,096,133 B2 | 8/2006 | Martin et al. |
| 6,937,020 B2 | 8/2005 | Munson et al. | | 7,161,363 B2 | 1/2007 | Gleason et al. |
| 6,937,037 B2 | 8/2005 | Eldridge et al. | | 7,173,433 B2 | 2/2007 | Hoshi et al. |
| 6,937,040 B2 | 8/2005 | Maeda et al. | | 7,187,188 B2 | 3/2007 | Andrews et al. |
| 6,937,042 B2 | 8/2005 | Yoshida et al. | | 7,188,037 B2 | 3/2007 | Hidehira |
| 6,937,045 B2 | 8/2005 | Sinclair | | 7,219,416 B2 * | 5/2007 | Inoue et al. .................. 29/606 |
| 6,937,341 B1 | 8/2005 | Woollam et al. | | 7,233,160 B2 | 6/2007 | Hayden et al. |
| 6,940,264 B2 | 9/2005 | Ryken, Jr. et al. | | 7,253,646 B2 | 8/2007 | Lou et al. |
| 6,940,283 B2 | 9/2005 | McQueeney | | 7,271,603 B2 | 9/2007 | Gleason et al. |
| 6,943,563 B2 | 9/2005 | Martens | | 7,276,922 B2 | 10/2007 | Miller et al. |
| 6,943,571 B2 | 9/2005 | Worledge | | 7,315,175 B2 | 1/2008 | Cole |
| 6,943,574 B2 | 9/2005 | Altmann et al. | | 7,319,335 B2 | 1/2008 | Brunner et al. |
| 6,944,380 B1 | 9/2005 | Hideo et al. | | 7,319,337 B2 | 1/2008 | Sakata |
| 6,946,375 B2 | 9/2005 | Karavakis et al. | | 7,323,680 B2 | 1/2008 | Chong |
| 6,946,859 B2 | 9/2005 | Karavakis et al. | | 7,323,899 B2 | 1/2008 | Schuette et al. |
| 6,946,860 B2 | 9/2005 | Cheng et al. | | 7,327,153 B2 | 2/2008 | Weinraub |
| 6,946,864 B2 | 9/2005 | Gramann et al. | | 7,332,918 B2 | 2/2008 | Sugiyama et al. |
| 6,948,391 B2 | 9/2005 | Brassell et al. | | 7,332,923 B2 | 2/2008 | Schott et al. |
| 6,948,981 B2 | 9/2005 | Pade | | 7,342,402 B2 | 3/2008 | Kim et al. |
| 6,949,942 B2 | 9/2005 | Eldridge et al. | | 7,403,028 B2 | 7/2008 | Campbell |
| 6,970,001 B2 | 11/2005 | Chheda et al. | | 2001/0002794 A1 | 6/2001 | Draving et al. |
| 6,987,483 B2 | 1/2006 | Tran | | 2001/0009061 A1 | 7/2001 | Gleason et al. |
| 7,001,785 B1 | 2/2006 | Chen | | 2001/0009377 A1 | 7/2001 | Schwindt et al. |
| 7,002,133 B2 | 2/2006 | Beausoleil et al. | | 2001/0010468 A1 | 8/2001 | Gleason et al. |
| 7,002,363 B2 | 2/2006 | Mathieu | | 2001/0020283 A1 | 9/2001 | Sakaguchi |
| 7,002,364 B2 | 2/2006 | Kang et al. | | 2001/0024116 A1 | 9/2001 | Draving |
| 7,003,184 B2 | 2/2006 | Ronnekleiv et al. | | 2001/0030549 A1 | 10/2001 | Gleason et al. |
| 7,005,842 B2 | 2/2006 | Fink et al. | | 2001/0043073 A1 | 11/2001 | Montoya |
| 7,005,868 B2 | 2/2006 | McTigue | | 2001/0044152 A1 | 11/2001 | Burnett |
| 7,005,879 B1 | 2/2006 | Robertazzi | | 2001/0045511 A1 | 11/2001 | Moore et al. |
| 7,006,046 B2 | 2/2006 | Aisenbrey | | 2001/0054906 A1 | 12/2001 | Fujimura |
| 7,007,380 B2 | 3/2006 | Das et al. | | 2002/0005728 A1 | 1/2002 | Babson et al. |
| 7,009,188 B2 | 3/2006 | Wang | | 2002/0008533 A1 | 1/2002 | Ito et al. |
| 7,009,383 B2 | 3/2006 | Harwood et al. | | 2002/0009377 A1 | 1/2002 | Shafer |
| 7,009,415 B2 | 3/2006 | Kobayashi et al. | | 2002/0009378 A1 | 1/2002 | Obara |
| 7,011,531 B2 | 3/2006 | Egitto et al. | | 2002/0011859 A1 | 1/2002 | Smith et al. |
| 7,012,425 B2 | 3/2006 | Shoji | | 2002/0011863 A1 | 1/2002 | Takahashi et al. |
| 7,012,441 B2 | 3/2006 | Chou et al. | | 2002/0030480 A1 | 3/2002 | Appen et al. |
| 7,013,221 B1 | 3/2006 | Friend et al. | | 2002/0050828 A1 | 5/2002 | Seward, IV et al. |
| 7,014,499 B2 | 3/2006 | Yoon | | 2002/0070743 A1 | 6/2002 | Felici et al. |
| 7,015,455 B2 | 3/2006 | Mitsuoka et al. | | 2002/0070745 A1 | 6/2002 | Johnson et al. |
| 7,015,689 B2 | 3/2006 | Kasajima et al. | | 2002/0079911 A1 | 6/2002 | Schwindt |
| 7,015,690 B2 | 3/2006 | Wang et al. | | 2002/0105396 A1 | 8/2002 | Streeter et al. |
| 7,015,703 B2 | 3/2006 | Hopkins et al. | | 2002/0109088 A1 | 8/2002 | Nara et al. |

| | | |
|---|---|---|
| 2002/0118034 A1 | 8/2002 | Laureanti |
| 2002/0149377 A1 | 10/2002 | Hefti et al. |
| 2002/0153909 A1 | 10/2002 | Petersen et al. |
| 2002/0163769 A1 | 11/2002 | Brown |
| 2002/0168659 A1 | 11/2002 | Hefti et al. |
| 2002/0176160 A1 | 11/2002 | Suzuki et al. |
| 2002/0180466 A1 | 12/2002 | Hiramatsu et al. |
| 2002/0197709 A1 | 12/2002 | Van der Weide et al. |
| 2003/0010877 A1 | 1/2003 | Landreville et al. |
| 2003/0030822 A1 | 2/2003 | Finarov |
| 2003/0032000 A1 | 2/2003 | Liu et al. |
| 2003/0040004 A1 | 2/2003 | Hefti et al. |
| 2003/0057513 A1 | 3/2003 | Leedy |
| 2003/0062915 A1 | 4/2003 | Arnold et al. |
| 2003/0072549 A1 | 4/2003 | Facer et al. |
| 2003/0076585 A1 | 4/2003 | Ledley |
| 2003/0077649 A1 | 4/2003 | Cho et al. |
| 2003/0088180 A1 | 5/2003 | Van Veen et al. |
| 2003/0119057 A1 | 6/2003 | Gascoyne et al. |
| 2003/0139662 A1 | 7/2003 | Seidman |
| 2003/0139790 A1 | 7/2003 | Ingle et al. |
| 2003/0155939 A1 | 8/2003 | Lutz et al. |
| 2003/0170898 A1 | 9/2003 | Gunderson et al. |
| 2003/0184332 A1 | 10/2003 | Tomimatsu et al. |
| 2003/0215966 A1 | 11/2003 | Rolda et al. |
| 2003/0234659 A1 | 12/2003 | Zieleman |
| 2004/0015060 A1 | 1/2004 | Samsoondar et al. |
| 2004/0021475 A1 | 2/2004 | Ito et al. |
| 2004/0029425 A1 | 2/2004 | Yean et al. |
| 2004/0061514 A1 | 4/2004 | Schwindt et al. |
| 2004/0066181 A1 | 4/2004 | Theis |
| 2004/0069776 A1 | 4/2004 | Fagrell et al. |
| 2004/0090223 A1 | 5/2004 | Yonezawa |
| 2004/0095145 A1 | 5/2004 | Boudiaf et al. |
| 2004/0095641 A1 | 5/2004 | Russum et al. |
| 2004/0100276 A1 | 5/2004 | Fanton |
| 2004/0100297 A1 | 5/2004 | Tanioka et al. |
| 2004/0108847 A1 | 6/2004 | Stoll et al. |
| 2004/0113640 A1 | 6/2004 | Cooper et al. |
| 2004/0130787 A1 | 7/2004 | Thome-Forster et al. |
| 2004/0132222 A1 | 7/2004 | Hembree et al. |
| 2004/0134899 A1 | 7/2004 | Hiramatsu et al. |
| 2004/0140819 A1 | 7/2004 | McTigue et al. |
| 2004/0147034 A1 | 7/2004 | Gore et al. |
| 2004/0162689 A1 | 8/2004 | Jamneala et al. |
| 2004/0170312 A1 | 9/2004 | Soenksen |
| 2004/0175294 A1 | 9/2004 | Ellison et al. |
| 2004/0186382 A1 | 9/2004 | Modell et al. |
| 2004/0193382 A1 | 9/2004 | Adamian et al. |
| 2004/0197771 A1 | 10/2004 | Powers et al. |
| 2004/0199350 A1 | 10/2004 | Blackham et al. |
| 2004/0201388 A1 | 10/2004 | Barr |
| 2004/0207072 A1 | 10/2004 | Hiramatsu et al. |
| 2004/0207424 A1 | 10/2004 | Hollman |
| 2004/0239338 A1 | 12/2004 | Johnsson et al. |
| 2004/0246004 A1 | 12/2004 | Heuermann |
| 2004/0251922 A1 | 12/2004 | Martens et al. |
| 2005/0024069 A1 | 2/2005 | Hayden et al. |
| 2005/0026276 A1 | 2/2005 | Chou |
| 2005/0030047 A1 | 2/2005 | Adamian |
| 2005/0054029 A1 | 3/2005 | Tomimatsu et al. |
| 2005/0062533 A1 | 3/2005 | Vice |
| 2005/0068054 A1 | 3/2005 | Mok et al. |
| 2005/0083130 A1 | 4/2005 | Grilo |
| 2005/0088191 A1 | 4/2005 | Lesher |
| 2005/0101846 A1 | 5/2005 | Fine et al. |
| 2005/0116730 A1 | 6/2005 | Hsu |
| 2005/0142033 A1 | 6/2005 | Glezer et al. |
| 2005/0151548 A1 | 7/2005 | Hayden et al. |
| 2005/0156675 A1 | 7/2005 | Rohde et al. |
| 2005/0164160 A1 | 7/2005 | Gunter et al. |
| 2005/0165316 A1 | 7/2005 | Lowery et al. |
| 2005/0168722 A1 | 8/2005 | Forstner et al. |
| 2005/0172703 A1 | 8/2005 | Kley |
| 2005/0174191 A1 | 8/2005 | Brunker et al. |
| 2005/0178980 A1 | 8/2005 | Skidmore et al. |
| 2005/0179444 A1 | 8/2005 | Tiemeijer |
| 2005/0195124 A1 | 9/2005 | Puente Baliarda et al. |
| 2005/0229053 A1 | 10/2005 | Sunter |
| 2005/0236587 A1 | 10/2005 | Kodama et al. |
| 2005/0237102 A1 | 10/2005 | Tanaka |
| 2006/0030060 A1 | 2/2006 | Noguchi et al. |
| 2006/0052075 A1 | 3/2006 | Galivanche et al. |
| 2006/0155270 A1 | 7/2006 | Hancock et al. |
| 2006/0184041 A1 | 8/2006 | Andrews et al. |
| 2006/0220663 A1 | 10/2006 | Oikawa |
| 2006/0226864 A1 | 10/2006 | Kramer |
| 2007/0024506 A1 | 2/2007 | Hardacker |
| 2007/0030021 A1 | 2/2007 | Cowan et al. |
| 2007/0145989 A1 | 6/2007 | Zhu et al. |
| 2008/0111571 A1 | 5/2008 | Smith et al. |

FOREIGN PATENT DOCUMENTS

| | | |
|---|---|---|
| CN | 1083975 | 3/1994 |
| DE | 2951072 | 7/1981 |
| DE | 3426565 | 1/1986 |
| DE | 3637549 | 5/1988 |
| DE | 288234 | 3/1991 |
| DE | 4223658 | 1/1993 |
| DE | 9313420 | 10/1993 |
| DE | 19522774 | 1/1997 |
| DE | 19542955 | 5/1997 |
| DE | 19618717 | 1/1998 |
| DE | 19749687 | 5/1998 |
| DE | 29809568 | 10/1998 |
| DE | 10000324 | 7/2001 |
| DE | 20220754 | 5/2004 |
| EP | 0230766 | 12/1985 |
| EP | 0195520 | 9/1986 |
| EP | 0230348 | 7/1987 |
| EP | 0259163 | 3/1988 |
| EP | 0259183 | 3/1988 |
| EP | 0259942 | 3/1988 |
| EP | 0261986 | 3/1988 |
| EP | 0270422 | 6/1988 |
| EP | 0333521 | 9/1989 |
| EP | 0460911 | 12/1991 |
| EP | 0846476 | 6/1998 |
| EP | 0 945 736 | 9/1999 |
| EP | 0945736 | 9/1999 |
| GB | 579665 | 8/1946 |
| GB | 2014315 | 8/1979 |
| GB | 2179458 | 3/1987 |
| JP | 52-19046 | 2/1977 |
| JP | 53-037077 | 4/1978 |
| JP | 53037077 | 4/1978 |
| JP | 53-052354 | 5/1978 |
| JP | 55-115383 | 9/1980 |
| JP | 55115383 | 9/1980 |
| JP | 56-007439 | 1/1981 |
| JP | 56-88333 | 7/1981 |
| JP | 5691503 | 7/1981 |
| JP | 56088333 | 7/1981 |
| JP | 57-075480 | 5/1982 |
| JP | 57075480 | 5/1982 |
| JP | 57-163035 | 10/1982 |
| JP | 57163035 | 10/1982 |
| JP | 57171805 | 10/1982 |
| JP | 58-130602 | 8/1983 |
| JP | 594189 U | 1/1984 |
| JP | 60-5462 | 4/1984 |
| JP | 60-236241 | 11/1985 |
| JP | 61142802 | 6/1986 |
| JP | 62-11243 | 1/1987 |
| JP | 62-51235 | 3/1987 |

| | | |
|---|---|---|
| JP | 62-58650 | 3/1987 |
| JP | 62-098634 | 5/1987 |
| JP | 62-107937 | 5/1987 |
| JP | 62098634 | 5/1987 |
| JP | 62107937 | 5/1987 |
| JP | 62-179126 | 8/1987 |
| JP | 62-239050 | 10/1987 |
| JP | 62239050 | 10/1987 |
| JP | 62295374 | 12/1987 |
| JP | 63-108736 | 5/1988 |
| JP | 63-129640 | 6/1988 |
| JP | 63-143814 | 6/1988 |
| JP | 63-152141 | 6/1988 |
| JP | 63-192246 | 8/1988 |
| JP | 63-318745 | 12/1988 |
| JP | 64-21309 | 2/1989 |
| JP | 1-165968 | 6/1989 |
| JP | 1-214038 | 8/1989 |
| JP | 01209380 | 8/1989 |
| JP | 1-219575 | 9/1989 |
| JP | 1-296167 | 11/1989 |
| JP | 2-22836 | 1/1990 |
| JP | 2-124469 | 5/1990 |
| JP | 2-141681 | 5/1990 |
| JP | 02124469 | 5/1990 |
| JP | 02135804 | 5/1990 |
| JP | 2-191352 | 7/1990 |
| JP | 3-175367 | 7/1991 |
| JP | 3-196206 | 8/1991 |
| JP | 3196206 | 8/1991 |
| JP | 3-228348 | 10/1991 |
| JP | 03228348 | 10/1991 |
| JP | 4-130639 | 5/1992 |
| JP | 04130639 | 5/1992 |
| JP | 4-159043 | 6/1992 |
| JP | 04159043 | 6/1992 |
| JP | 4-206930 | 7/1992 |
| JP | 04206930 | 7/1992 |
| JP | 4-340248 | 11/1992 |
| JP | 5-082631 | 4/1993 |
| JP | 05082631 | 4/1993 |
| JP | 5-113451 | 5/1993 |
| JP | 51-57790 | 6/1993 |
| JP | 5157790 | 6/1993 |
| JP | 51-66893 | 7/1993 |
| JP | 5166893 | 7/1993 |
| JP | 6-85044 | 3/1994 |
| JP | 60-71425 | 3/1994 |
| JP | 6-102313 | 4/1994 |
| JP | 6-132709 | 5/1994 |
| JP | 6-160236 | 6/1994 |
| JP | 6154238 | 6/1994 |
| JP | 6-295949 | 10/1994 |
| JP | 7-005078 | 1/1995 |
| JP | 7-12871 | 1/1995 |
| JP | 7005078 | 1/1995 |
| JP | 7012871 | 1/1995 |
| JP | 7-201945 | 8/1995 |
| JP | 8-35987 | 2/1996 |
| JP | 8035987 | 2/1996 |
| JP | 8-261898 | 10/1996 |
| JP | 8-330401 | 12/1996 |
| JP | 08330401 | 12/1996 |
| JP | 09127432 | 5/1997 |
| JP | 10-48256 | 2/1998 |
| JP | 10-116866 | 5/1998 |
| JP | 10116866 | 5/1998 |
| JP | 11-023975 | 1/1999 |
| JP | 11004001 | 1/1999 |
| JP | 11023975 | 1/1999 |
| JP | 2000-137120 | 5/2000 |
| JP | 2000-329664 | 11/2000 |
| JP | 2001-33633 | 2/2001 |
| JP | 2001-124676 | 5/2001 |
| JP | 2001-189285 | 7/2001 |
| JP | 2001-189378 | 7/2001 |
| JP | 2002-203879 | 7/2002 |
| JP | 2002-243502 | 8/2002 |
| JP | 2002243502 | 8/2002 |
| JP | 2004-507851 | 3/2004 |
| KR | 2003/0090158 | 11/2003 |
| SU | 843040 | 6/1981 |
| SU | 1195402 | 11/1985 |
| SU | 1327023 | 7/1987 |
| SU | 1392603 | 4/1988 |
| WO | WO80/00101 | 1/1980 |
| WO | WO94/10554 | 5/1994 |
| WO | WO 96/29629 | 1/1996 |
| WO | WO 97/50001 | 12/1997 |
| WO | WO98/07040 | 2/1998 |
| WO | WO 00/73905 | 12/2000 |
| WO | WO01/07207 | 2/2001 |
| WO | WO 01/69656 | 9/2001 |
| WO | WO 2004/044604 | 5/2004 |
| WO | WO 2004/065944 | 8/2004 |
| WO | WO 2004/079299 | 9/2004 |
| WO | WO 2005/062025 | 7/2005 |
| WO | WO 2007/145727 | 12/2007 |
| WO | WO 2007/145728 | 12/2007 |

OTHER PUBLICATIONS

Bob Stengel, "Neutralized Differential Amplifiers using Mixed-Mode s-parameters," 2003 IEEE Radio Frequency Integrated Circuits Symposium, pp. 711-714.

Cohn, S, "Properties of Ridge Wave Guide," Proceedings of the I.R.E., Aug. 1947, pp. 783-788.

Cohn, Seymour B., "Optimum Design of Stepped Transmission-Line Transformers," I.R.E. Transactions—Microwave Theory and Techniques, No. 3, 1955, pp. 16-21.

Hopper, Samuel, "The Design of Ridged Waveguides," I.R.E. Transactions—Microwave Theory and techniques, No. 5, Oct. 1955, pp. 20-29.

Chen, Tsung-Shan, "Calculation of Parameters of Ridge Waveguides," IRE Transactions on Microwave Theory and Techniques, Jan. 1957, pp. 12-17.

IRE 20.1, Committee Personnel, "IRE Standards on Methods of Measuring Noise in Linear Twoports, 1959," Proc. IRE, vol. 48, pp. 60-68, Jan. 1960, pp. 32-40.

Fukui, H., "Available Power Gain, Noise Figure, and Noise Measure of Two-Ports and Their Graphical Representations," pp. 18-23, Reprinted from IEEE Trans. Circuit Theory, vol. CT-13, pp. 137-142, Jun. 1966.

Beaubien, M.J., et al., "An Accurate Finite-Difference Method for Higher Order Waveguide Modes," IEEE Transactions on Microwave Theory and Techniques, vol. M11-16, No. 12, Dec. 1968, pp. 1007-1017.

Lane, Richard Q., "The Determination of Device Noise Parameters," Proc. IEEE, vol. 57, Aug. 1969, pp. 1461-1462.

Adamian, Vaheh, et al., "A Novel Procedure for Receiver Noise Characterization," IEEE Transactions on Instrumentaton and Measurement, Jun. 1973.

Daly, P., "Polar Geometry Waveguides by finite-element Methods," IEEE Transactions on Microwave Theory and Technique, vol. MTT-22, No. 3, Mar. 1974, pp. 202-209.

Fink, Donald G., et al., "Electronics Engineers' Handbook," Sec. 17-52 Measurement and Control Circuits, 1975, pp. 17- 22-17-27.

Bry, A., et al, "Bypass Capacitor for Chip Probe," IBM Technical Disclosure Bulletin, vol. 18, No. 11, Apr. 1976.

Skobern, J.R., "Subminiature High-Frequency Probe," IBM Technical disclosure Bulletin, vol. 19, No. 10, Mar. 1977.

Berg, William, et al., "Elastomers solve tough problems in high-frequency systems," 2119 EDN vol. 23, Jan. 5, 1978, pp. 36-42.

Eisenhart, R.L., "A Better Microstrip Connector," 1978 IEEE MTT-S International Microwave Symposium Digest, Jun. 27-29, Ottawa, Canada.

Gommlich, Hans, et al., "Verzerrungsmessungen-Wichtige Aufgabe in der Ubertragungstechnik," Elektronik 8/ Apr. 23, 1982, pp. 110-119.

Larock, V., et al., "Automatic Noise Temperature Measurement Through Frequency Variation," IEEE Transactions on Microwave Theory and Techniques, vol. MTT-30, No. 8, Aug. 1982, pp. 1286-1288.

Maury Microwave Corp., "Transistor Test Fixture (TTF) Inserts, Calibration & Check Devices, MT951, MT952, MT953 Series," Advanced Data 4T-002, Sep. 20, 1982, pp. 1-2.

Maury Microwave Corp., "Transistor Test Fixture (TTF) Software," MT950D Series, Sep. 20, 1982, 2 pages.

Maury Microwave Corp., "Transistor Test Fixture (TTF)," MT950 Series, Advanced data 4T-001, Oct. 7, 1982.

Abbott, D.A., et al., "Automatic noise figure measurements with computer control and correction," 8054 Radio and Electronic Engineer vol. 52, Oct. 1982, pp. 468-474.

Swain, Howard L. et al., "Noise Figure Meter Sets Records for Accuracy, Repeatability, and Convenience," 1266 Hewlett-Packard Journal, vol. 34, No. 4, Apr. 1983, pp. 23-34.

Adamian, V. et al., "Simplified Noise Evaluation of Microwave Receiver," IEEE Transactions on Instrumentation and Measurement, vol. IM-33, No. 2, Jun. 1984, 136-140.

Pastori, William E., "High accuracy microwave noise figure measurements," 8029 Electronic Engineering 56, No. 1984, pp. 181-189.

Inter-Continental Microwave, "Product Catalog," VMC 1055 Jan. 1986.

Design Technique, "Microstrip Microwave Test Fixture," May 1986.

Cascade Microtech, Inc., "Wide Probe Assembly," Full Scale Drawing, May 29, 1986, 2 pages.

Jackson, Robert et al., "Surface-to-Surface Transition via Electromagnetic Coupling of Coplanar Waveguides," Nov. 1987, 8099 IEEE Transactions on Microwave Theory and Techniques MTT-35, pp. 1027-1032.

Sharma, A., "Tunable Waveguide-to-Microstrip Transition for Millimeter-Wave Applications," IEE MTT-S Digest 1987, pp. 353-356.

Izadian, Jamal S., "Unified Design Plans Aid Waveguide Transitions," Microwaves & R&F, May 1987, pp. 213-222.

Mazilu, T., "A Self-Adjusting Waveguide-to-Microstrip Transition," Microwave Journal, Jul. 1987, pp. 133-134.

Carlton, D.E. et al., "Accurate Measurement of High-speed Package and Interconnect Parasitics," IEEE 1988 Custom Integrated Circuits Conference, pp. 23.3.1-23.3.6.

Fraser, Artur, et al., "GHz On-Silicon-Wafer Probing Calibration Methods," Paper 7.6, IEEE 1988 Bipolor Circuits & Technology Meeting, pp. 154-157.

Modolo, John A., et al, "Wafer level high-frequency measurements of photodetector characteristics," Applied Optics, vol. 27 pp. 3059-3061, Aug. 1988.

Design Technique, "Adjustable Test Fixture," 1988.

Tong, Peter R., et al., "Noise Measurements at MM-Wave Frequencies," 176 Microwave Journal 31, Jul. 1988.

Barsotti, C., et al., "New Probe Cards Replace Needle Types," Semiconductor International, Aug. 1988, pp. 98-101.

Microwave Journal, "Microwave Products," Sep. 1988, pp. 297.

Cascade Microtech Microprobe Update, "Spurious propagation, modes removed by probe absorber," Apr. 1989.

Esteban, J., et al., "Mode Spectrum of Waveguides Using A Transverse S-Matrix Resonance Method," AP-S International Symposium 1989, IEEE Catalog No. CH-2654-2189, San Jose, CA, Jun. 26-30, 1989, pp. 1263-1267.

Ponchak, George, et al., "A New Rectangular Waveguide to Coplaner Waveguide Transition," Prepared for 1990 IEEE MTT-S International Microwave Symposium to be held between May 8-10, 1990 in Dallas, Texas, Jan. 1990.

Dalman, G.C., "New Waveguide-to-Coplaner Waveguide Transition for Centimetre and Millimetre Wave Applications," Electronics Letters, Jun. 21, 1990, vol. 26, No. 13.

Cascade Microtech WPH-700 series, "Multicontact High-Speed Integrated Circuit," 1991, 700S-591.

Liu, S.M. Joseph, et al., "A New Probe for W-band On-wafer Measurements," IEEE MTT-S Digest, 1993, pp. 1335-1338.

Photo of Micromanipulator Probe Station, 1994.

Maury Microwave Corp., Transistor Test Fixture (TTF) MT950 Series, May 31, 1995, Advanced Data, 4T-0011.

Cascade Microtech, "Layout rules for WPH-900 Series probes," Applications Note, 1996.

Cascade Microtech, "Air coplanar Probe Series," 1997.

Yong-Dae, Kim, et al. "Fabrication of silicon Micro-Probe for Vertical Probe Card Application," Jpn. J. Appl. Phys. vol. 37, Part 1, No. 12B, Dec. 1998, pp. 7070-7073.

"A Broadband Microwave choke," Microwave Journal, Dec. 1999.

"The Air Coplanar Probe offers a highly compliant, rugged probe with lowest insertion loss available," Cascade Microtech, Inc., Air coplanar Probe Series, 2000.

Cascade Microtech, "On-Wafer Test Solutions for State-of-the-Art Electro-Optical Components," 2001.

Purroy. F. et al., "New Theoretical Analysis of the LRRm Calibration Technique for Vector Network Analyzers," IEEE Transactions on Instrumentation and Measurement, vol. 50, No. 5, Oct. 2001, pp. 1307-1313.

"Laser Diode Test Solution," Oct. 9, 2002, http:/www.cascademicrotech.com/index.cfm/fuseaction/pg.view/pID/136.

Liang, Qingqing, et al., "Accurate ac Transistor Characterization to 110 GHz Using a New Four-port Self-Calibrated Extraction Technique," 2004 Topical Meeting on Silicon Monolitic Integrated Circuits in RF Systems, pp. 282-285.

Basu, S., et al, "A Membrane Quandrant Probe for R&D Applications," Cascade Microtech, Inc. At Least one year prior to filing.

Electrical Operation, Calibration and Measurement Steps with the HP 8510, At least one year prior to filing.

Whinnery, J.R. et al., "Equivalent Circuits for Discontinuities in Transmission Lines," Proceedings of IRE, at least one year prior to filing.

Inter-Continental Microwave, Application Note: 101, Microwave Semiconductor Chip Measurements using the HP 8510B TRL-Calibration Technique, at least one year prior to filing.

Cascade Microtech, "Special Purpose Probe 40/80 Gb/s High Performance Quandrant," at least one year prior to filing.

Agilent Technology Product Information, HPW281D Waveguide Adapter, 1 mm (m) to W-Band, 75 GHz to 110 GHz.

Cascade Microwave, "Introducing the World's First Microwave Wafer Probing Equipment," 4 pages, 1983.

Malm, R.L. "Reduction of Stray Fields About SEM Samples," IBM Technical Disclosure Bulletin, vol. 21, No. 7, Dec. 1978 2 pages.

Kuhn, Nick, "Accurate and Automatic Noise Figure Measurements with Standard Equipment," Hewlett-Packard co., Inc., Stanford Park Division 1501 Page Mill Road, Palo Alto, CA 94304, 3 pages Conference: Technology Grow for the 80's. 1980 IEEE MTT-S International Microwave Symposium Digest, Washington, DC, May 28-30, 1980.

International Search Report for PCT/US06/16238 mailed Feb. 28, 2007.

Written Opinion of the International Searching Authority for PCT/US06/16238, mailed Feb. 28, 2007.

Partial International Search Report for PCT/US2005/039561, mailed Mar. 21, 2006.

International Search Report for PCT/US2005/039561, mailed May 18, 2006.

Written Opinion of the International Searching Authority for PCT/US2005/039561, mailed May 18, 2006.

Mark S. Boguski and Martin W. McIntosh, "Biomedical informatics for proteomics," insight: review article, Nature 422, 233-237 (2003); doi:10.1038/nature01515.

Daniel Vanderweide, "THz Frequency Science & Technology Biomolecular Interaction Sensing with Sub-Terahertz Fields," University of Wisconsin-Madison, 2 pages, date unknown.

L.L. Sohn, O.A.Saleh, G.R. Facer, A.J. Beavis, R.S. Allan, and D.A. Notterman, "Capacitance cytometry: Measuring biological cells one by one," PNAS Sep. 26, 2000, vol. 97 No. 20 pp. 10687-10690, www.pnas.org.

Sam Hanash, "insight review articles, Disease proteomics," Nature, vol. 422, Mar. 13, 2003, pp. 226-232.

Mike Tyers and Matthias Mann, "insight overview, From genomics to proteomics," Nature, vol. 422, Mar. 13, 2003, pp. 193-197.

Andrej Sali, Robert Glaeser, Thomas Earnest, and Wolfgang Baumeister, "insight: review article From words to literature in structural proteomics," Nature 422, 216-225 (2003); doi: 10.1038/nature01513.

Ruedi Aebersold and Matthias Mann, "insight review articles, Mass spectrometry-based proteomics," Nature, vol. 422, Mar. 13, 2003, pp. 198-207.

Barbara Marte, Senior Editor, "Nature insight Proteomics," Nature vol. 422, Mar. 13, 2003 pp. 191-194.

Eric Phizicky, Philippe I. H. Bastiaens, Heng Zhu, Michael Snyder, and Stanley Fields, "insight: review article Protein analysis on a proteomic scale," Nature 422, 208-215 (2003); doi: 10.1038/nature01512.

Qingqing Liang, et al., "Accurate ac Transistor Characterization to 110 GHz Using a New Four-port Self-Calibrated Extraction Technique," IEEE, 2004 Topical Meeting on Silicon Monolithic Integrated Circuits in RF Systems, pp. 282-285.

Francesc Purroy and Lluis Pradell, "New Theoretical Analysis of the LRRM Calibration Technique for Vector Network Analyzers," IEEE Transactions on Instrumentation and Measurement, vol. 50, No. 5, Oct. 2001, pp. 1307-1313.

Christophe Risacher, et al., "Waveguide-to-Microstrip Transition With Integrated Bias-T," IEEE Microwave and Wireless Components Letters, vol. 13, No. 7, Jul. 2003, pp. 262-264.

Saswata Basu and Leonard Hayden, "An SOLR Calibration for Accurate Measurement of Orthogonal On-Wafer DUTS," 1997 IEEE MTT-S Digest, pp. 1335-1338.

J. Martens, "Multiport SOLR Calibrations: Performance and an Analysis of Some Standards Dependencies," pp. 205-213, Anritsu Company, 490 Jarvis Drive, Morgan Hill, CA 95037, jmartens@anritsu.com.

Deming Xu, Liping Liu, and Zhiyan Jiang, "Measurement of the Dielectric Properties of Biological Substances Using an Improved Open-Ended Coaxial Line Resonator Method," IEEE Transactions on Microwave Theory and Techniques, vol. MTT-35, No. 12, Dec. 1987, pp. 1424-1428.

Mohammed Nurul Afsar, James R. Birch, and R. N. Clarke, "The Measurement of the Properties of Materials," Proceedings of the IEEE, vol. 74, No. 1, Jan. 1986, pp. 183-199.

M.S. Venkatesh and G.S.V. Raghavan, "An overview of dielectric properties measuring techniques," vol. 47, 2005, Canadian Biosystems Engineering, pp. 7.15-7.30.

Andrzej W. Kraszewski, Stuart O. Nelson, and Tian-Su You, "Use of a Microwave Cavity for Sensing Dielectric Properties of Arbitrarily Shaped Biological Objects," IEEE Transactions on Microwave Theory and Techniques, vol. 338, No. 7, Jul. 1990, pp. 858-863.

Leonard Hayden, "A Multi-Line TRL Calibration," Feb. 2, 1994, 5 pages.

Christophe Seguinot, et al., "Multimode TRL—A New concept in Microwave Measurements: Theory and Experimental Verification," IEEE Transactions On Microwave Theory and Techniques, vol. 46, No. 5, May 1998, pp. 536-542.

Roberto Tinti, Franz Sischka, and Chris Morton, "Proposed System Solution for 1/f Noise Parameter Extraction," Agilent Technologies Comms EDA, 1400 Fountaingrove Pkw, Santa Rosa, CA, 95403, 7 pages.

Robert D. Grober, Robert J. Schoelkopf, and Daniel E. Prober, "Optical antenna: towards a unity efficiency near-field optical probe," Appl. Phys. Lett. 70(11), Mar. 17, 1997, 1997 American Insitute of Physics, pp. 1354-1356.

Cascade Microtech, "Probe Heads Care and cleaning of coaxial input microwave probes," Microwave Probe Care and Cleaning, Instruction Manual, Copyright 1990.

* cited by examiner

DIFFERENTIAL SIGNAL PROBE WITH INTEGRAL BALUN

CROSS-REFERENCE TO RELATED APPLICATIONS

This application claims the benefit of U.S. Provisional App. No. 60/812,150, filed Jun. 9, 2006.

BACKGROUND OF THE INVENTION

The present invention relates to probe measurement systems for testing integrated circuits and other microelectronic devices and, more particularly, probe measurement systems utilizing differential signals to test circuits and devices.

Integrated circuits (ICs) and other microelectronic devices are fabricated on the surface of a wafer or substrate and commonly utilize single ended or ground referenced signals that are referenced to a ground plane at the lower surface of the substrate on which the active and passive devices of the circuit are fabricated. As a result of the physical make up of the devices of an integrated circuit, parasitic interconnections exist between many of the parts of the individual devices and between parts of the devices and the wafer on which the devices are fabricated. These interconnections are commonly capacitive and/or inductive in nature and exhibit frequency dependent impedances. For example, the terminals of transistors fabricated on semi-conductive substrates or wafers are typically capacitively interconnected, through the substrate, to the ground plane and, at higher frequencies, the ground potential and the true nature of ground referenced signals becomes uncertain. Balanced devices utilizing differential signals are more tolerant to poor radio frequency (RF) grounding than single ended devices making them increasingly attractive as ICs are operated at higher and higher frequencies.

Referring to FIG. 1, a differential gain cell 20 is a balanced device comprising two nominally identical circuit halves 20A, 20B. When biased with direct current, for example, a current sourced from a DC current source 22, and stimulated with a differential mode signal, comprising even and odd mode components of equal amplitude and opposite phase ($S_i^{+1}$ and $S_i^{-1}$), a virtual ground is established at the symmetrical axis 26 of the two circuit halves. At the virtual ground, the potential at the operating frequency does not change with time regardless of the amplitude of the stimulating signal. The quality of the virtual ground of a balanced device is independent of the physical ground path enabling balanced or differential circuits to tolerate poor RF grounding better than circuits operated with single ended signals. In addition, the two component waveforms of the differential output signal ($S_o^{+1}$ and $S_o^{-1}$) are mutual references enabling digital devices to operate faster, with greater certainty in transitioning from one binary value to the other and with a reduced voltage swing for the signal. Moreover, balanced or differential circuits have good immunity to noise from external sources, such as adjacent conductors, because noise tends to couple, electrically and electromagnetically, in the common mode and cancel in the differential mode. The improved immunity to noise extends to even-harmonic frequencies since signals that are of opposite phase at the fundamental frequency are in phase at the even harmonics.

Following fabrication of the ICs, the individual dies on which the ICs are fabricated are separated or singulated and encased in a package that provides for electrical connections between the exterior of the package and the circuit on the enclosed die. The separation and packaging of a die comprises a significant portion of the cost of manufacturing a device that includes an IC and to monitor and control the IC fabrication process and avoid the cost of packaging defective dies, manufacturers commonly add electrical circuits or test structures to the wafer to enable on-wafer testing or "probing" to verify characteristics of elements of the integrated circuits before the dies are singulated. A test structure typically includes a device-under-test (DUT) 30, a plurality of metallic probe or bond pads 32 that are deposited at the wafer's surface and a plurality of conductive vias 34 that connect the bond pads to the DUT which is typically fabricated beneath the surface of the wafer with the same process that is used to fabricate the corresponding components of the marketable IC. The DUT typically comprises a simple circuit that includes a copy of one or more of the basic elements of the marketable integrated circuit, such as a single line of conducting material, a chain of vias or a single transistor. Since the circuit elements of the DUT are fabricated with the same process as the corresponding elements of the marketable integrated circuits, the electrical properties of the DUT are expected to be representative of the electrical properties of the corresponding components of the marketable integrated circuit.

The DUT of the test structure 40 comprises the differential gain cell 20, a common elemental device of balanced or differential circuitry. A differential gain cell has five terminals; four signal terminals and a bias terminal through which the transistors of the differential cell are biased. The four signal terminals comprise two input terminals to receive the even and odd mode components of the differential input signal from a signal source and two output terminals to transmit the even and odd mode components of the differential output signal for the differential gain cell to a signal sink. Two probes 42, 44 are commonly utilized when probing a test structure comprising a differential or balanced device. One probe typically conducts the signals from the signal source to the probe pads of the test structure and the second probe conducts the signals from the test structure to the signal sink. Typically, one of the two probes has at least three probe tips, in a signal-ground-signal arrangement, to conduct two of the differential signal components and to bias the transistors of the differential cell.

ICs are typically characterized "on-wafer" by applying a test instrument generated signal to the test structure and measuring the response of the test structure to the signal. Referring to FIG. 2, at higher frequencies, on-wafer characterization is commonly performed with a network analyzer 100. A network analyzer comprises a source 102 of an AC signal, often a radio frequency (RF) signal, that is used to stimulate the DUT 30 of a test structure. Directional couplers or bridges pick off the forward or reverse waves traveling to or from the test structure and direct them to a signal sink 104 where they are down-converted in intermediate frequency (IF) sections, filtered, amplified and digitized. The result of the signal processing in the network analyzer is a plurality of s-parameters (scattering parameters), the ratio of a normalized power wave comprising the response of the DUT to the normalized power wave comprising the stimulus supplied by the signal source, that register the response of the DUT to the stimulating signal. A forward-reverse switch 106 enables reversing the connections between the probe(s) and the network analyzer so that the respective pairs of probe pads receiving the input signal and transmitting the output signal can be reversed.

A four-port network analyzer is desirable when testing differential devices because it can output and receive differential signals enabling mixed mode analysis of the devices. However, four-port network analyzers are relatively uncommon and expensive. Two-port network analyzers are more common and often used when testing differential devices. However, two-port network analyzers output and receive single ended signals which must be converted to or from differential signals for stimulating the balanced device and analyzing its output.

The single ended signal output by the network analyzer may include a DC offset. If so, the output signal is commonly conducted to a bias tee 108 which comprises a capacitor 110 in series with the bias tee's radio frequency (RF) port 112 and an inductor 114, in series with a direct current (DC) port 116. The capacitor blocks transmission of the DC component of the signal from the RF port and the inductor blocks transmission of the modulated signal from the DC port but permits transmission of the DC portion of the signal. The DC port of the bias tee 108 is interconnected through the bias probe tip 140 to the bias probe pad 150 of the test structure enabling biasing of the transistors of the differential cell with the DC component of the output signal of the network analyzer.

The modulated signal from the RF port of the bias tee 108 is conducted to a balun 120 which converts the single ended signal to a balanced or differential signal comprising two differential signal components ($S_i^{+1}$ and $S_i^{-1}$) having substantially the same amplitude but opposite phase. Typically, the two components of the differential signal are transmitted over a coaxial cable from the balun to respective signal probe tips 146, 148 of a probe 42 which provides a transition from the signal path the coaxial cable to the signal path of the test structure's probe pads. The probe is movable relative to the test structure so that the each of the probe tips may be co-located with respective probe pads which are connected to the DUT.

The DUT sinks the differential input signals and outputs the differential output signal components ($S_o^{+1}$ and $S_o^{-1}$) which are conducted to respective probe pads 152, 154 of the differential gain cell. The components of the differential output signals are transmitted to a balun 122 which converts the differential signal components to a single ended signal which is transmitted to the signal sink 104 of the network analyzer for processing, analysis and display.

A balun used to convert single ended signals to differential signals and vice versa is commonly a transformer with an unbalanced connection made to one of the windings and a balanced connection made to the other winding and, typically, an expensive device. Further, baluns are typically large relative to the probe and are commonly remotely located and connected to the probe with coaxial cable which complicates the set up of the test instrumentation. What is desired, therefore, is a probe that incorporates a balun enabling use of a two-port network analyzer when probing differential circuits to reduce the cost and simplify the set up of the probing instrumentation.

DETAILED DESCRIPTION OF PREFERRED EMBODIMENTS

The integrity of an integrated circuit (IC) manufacturing process is commonly tested by fabricating a plurality of test structures on a wafer that includes one or more marketable ICs. The test structures are fabricated using the same processes that are used to fabricate the marketable ICs. Characteristics of the marketable ICs are inferred by stimulating the test structure with a test instrument generated signal and capturing the response of the test structure. While test structures are typically simple circuits, the response of similar devices included in the more complex marketable ICs is expected to be similar to the response of the test structure because the devices in the marketable ICs and similar devices in the test structures are fabricated with the same process.

Figure 1:
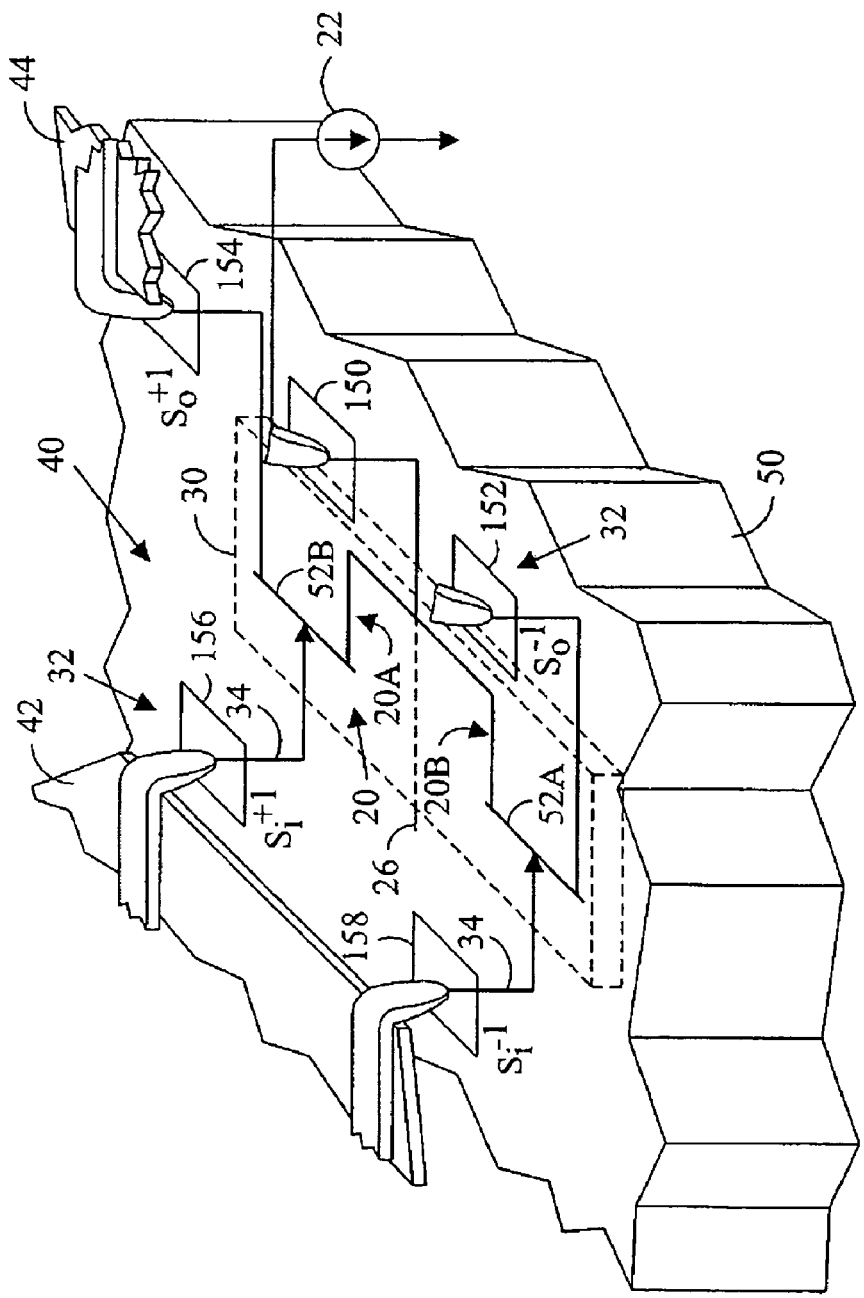
FIG. 1 is a perspective view of a portion of a substrate including a differential test structure.

Referring in detail to the drawings where similar parts are identified by like reference numerals, and, more particularly to FIG. 1, a test structure 40 typically comprises a plurality of conductive bond or probe pads 32 deposited on the surface of a wafer or substrate 50; a device-under-test or DUT 30, typically a simple circuit comprising circuit elements produced by the same process and in the same layers of the wafer as corresponding components of the marketable ICs; and a plurality of conductive vias 34 connecting the probe pads and the elements of the DUT. The exemplary test structure 40 comprises a DUT that includes a differential gain cell 20, a common element of circuitry that utilizes differential signals. Circuits utilizing differential signaling are becoming increasingly common particularly for higher frequency applications. Compared to devices utilizing single ended signals, differential signaling or balanced devices typically operate at lower power levels, provide faster state transition for binary devices, have greater immunity to noise and reduced susceptibility to electromagnetic coupling, and are more tolerant of poor grounding conditions which are commonly encountered when integrated circuits are operated at higher frequencies.

The exemplary differential gain cell 20 comprises two substantially identical field effect (JFET) transistors 52A and 52B. However, a DUT typically comprises components corresponding to the components utilized in the marketable integrated circuits fabricated on the wafer and other types of transistors, such as bipolar junction (BJT) transistors or MOSFET transistors can be used in the construction of a differential gain cell of a test structure and additional active or passive circuit elements may be included in the test structure. The test structure includes five probe pads 150, 152, 154, 156 and 158 through which the transistors of the DUT are biased and through which the two components of the differential input and output signals are communicated to and from the test structure. The source terminals of the transistors of the differential gain cell are interconnected as a transistor bias terminal which is interconnected with a bias probe pad 150. The gate terminals of the transistors are respectively connected to probe pads 156, 158 of a first pair of signal probe pads and the drains of the transistors are respectively interconnected to the probe pads 152, 154 of the second pair of signal probe pads. A differential mode input signal, comprising an even mode component ($S_i^{+1}$) and an odd mode component ($S_i^{-1}$) of substantially the same amplitude but opposite in phase to the even mode component, is applied to one pair of signal probe pads, for example probe pads 156 and 158, causing the differential gain cell to output a differential mode output signal comprising an even mode component ($S_o^{+1}$) and an odd mode component ($S_o^{-1}$) from the probe pads 152 and 154 of the other pair of signal probe pads. Conversely, the DUT may be tested by sinking the input signal components in the probe pads 152 and 154 and sourcing the output signals from the probe pads 156 and 158.

While differential signaling provides a number of advantages, testing circuits utilizing differential signals can be more complicated than testing circuits utilizing single ended signals because the test instrumentation used in on-wafer probing commonly transmits and receives only single ended signals. A four-port network analyzer can output differential signals directly permitting mixed mode analysis of differential test structures, but four-port network analyzers are relatively rare and expensive. Two port network analyzers are more common and less expensive and are commonly used for testing differential devices, but the single ended signals output by the network analyzer must be converted to differential signals for input to a differential test structure and the differential output signals of the test structure must converted to single ended signals for input to the signal sink of the network analyzer.

Figure 2:
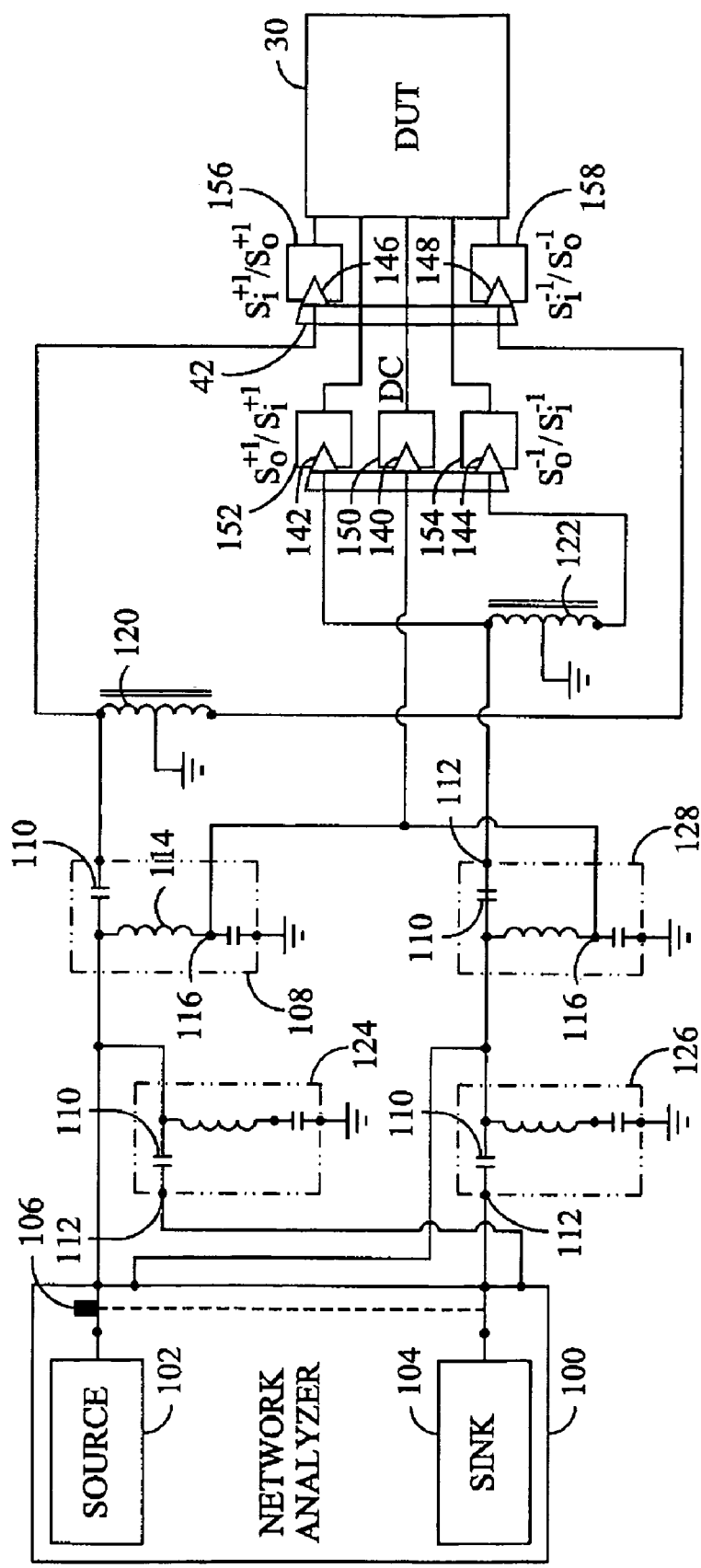
FIG. 2 is a schematic representation of a system for probing a differential test structure.

Referring to FIG. 2, a two-port network analyzer 100 comprises a signal source 102 that outputs a single ended signal and a signal sink 104 that receives a single ended signal transmitted from the DUT 30 of a test structure. The network analyzer also includes a forward-reverse switch 106 that enables reversing the connections to the source and the sink so that the terminals of the DUT receiving the input signals and transmitting the output signals can be reversed. For example, with the forward-reverse switch in the illustrated position the probe pads 156, 158 sink the differential input signal components ($S_i^{+1}$ and $S_i^{-1}$) and the output signal components ($S_o^{+1}$ and $S_o^{-1}$) are transmitted from the probe pads 152 and 154. When the forward-reverse switch is moved to the second position, the input signal will be applied to probe pads 152 and 154 and the output signal will be transmitted from probe pads 156 and 158. The single ended output signal from the source of the network analyzer is typically converted by a balun to a balanced or differential signal comprising differential components having substantially the same amplitude but opposite phase. Likewise, a balun converts the differential output signal of the differential DUT to a single ended signal for processing and display be the signal sink of the two-port network analyzer.

The single ended output signal of the network analyzer may include a DC offset. If so and with the forward-reverse switch in the illustrated position, the output signal is commonly conducted to a bias tee 108 which comprises a capacitor 110 in series with a radio frequency (RF) port 112 and an inductor 114, in series with a DC port 116. The capacitor blocks transmission of the DC component of the network analyzer signal from the RF port, but permits transmission of the modulated signal component from the RF port. On the other hand, the inductor blocks transmission of the modulated signal component from the DC port but permits transmission of the DC portion of the signal. The DC port of the bias tee 108 is interconnected through the bias probe tip 140 to the bias probe pad 150 of a test structure enabling biasing of the transistors of a differential cell with the DC component of a signal transmitted by the network analyzer. A third bias tee 124 and a fourth bias tee 126 prevent conduction of the DC bias signal to the signal sink of the network analyzer.

The modulated component of the network analyzer output is conducted from the RF port of the bias tee to a balun 120 which converts the single ended signal to a differential signal having two components of substantially equal amplitude and opposite phase. The differential input signal components, $S_i^{+1}$ and $S_i^{-1}$, are communicated to respective probe tips 146, 148, typically, via coaxial cables interconnecting the balun and the probe tips. The probe tips 146, 148 of the movable probe 42 are arranged so that they may be co-located with the respective signal probe pads 156, 158 which are interconnected with the DUT 30 of a test structure.

In response to the differential input signal, the differential gain cell of the DUT outputs two differential output signal components ($S_o^{+1}$ and $S_o^{-1}$). The differential output signal components are conducted from respective probe pads 152, 154 of the test structure to respective probe tips 142, 144. The probe tips are interconnected, typically by coaxial cable, to a second balun 122 which converts the differential signals to a single ended signal. The modulated single ended signal is transmitted to the signal sink 104 of the network analyzer.

When the forward-reverse switch is moved to the second position, the single ended output of the network analyzer is conducted to the second balun 122 through a second bias tee 128 which separates the DC component from the modulated portion of the signal enabling biasing of the DUT. The second balun 122 converts the modulated portion of the single-ended output of the network analyzer to the differential input signal components which are conducted to the DUT through probe tips 142 and 144 and probe pads 152 and 154. The output of the DUT is conducted to the probe pads 156 and 158 and, in turn, the probe tips 146 and 148. The differential output signal components are converted to a single ended signal in the first balun 120 and the single ended signal is transmitted through the first 108 and fourth 124 bias tees to the signal sink of the network analyzer.

Baluns are commonly used to convert the single ended signals transmitted by two-port network analyzers to differential signals and vice versa. Baluns are typically expensive, comprising a transformer with an unbalanced connection to one of the windings and a balanced connection to the other winding. The baluns are typically separate from the probe and connected to the probe with coaxial cable because the balun is relatively large compared to a probe. The present inventor realized that if a balun; and, preferably, an inexpensive balun; could be incorporated into the probe, the set up of the instrumentation could be substantially facilitated, reducing the time and cost of wafer probing.

Figure 3:
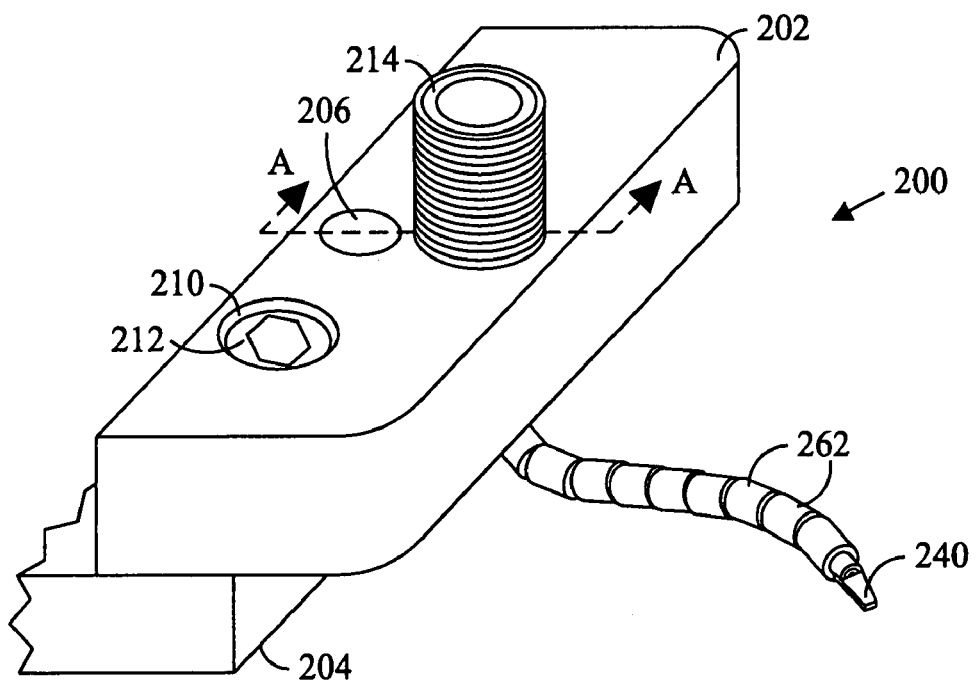
FIG. 3 is a perspective view of a probe with an integral balun.
Figure 4:
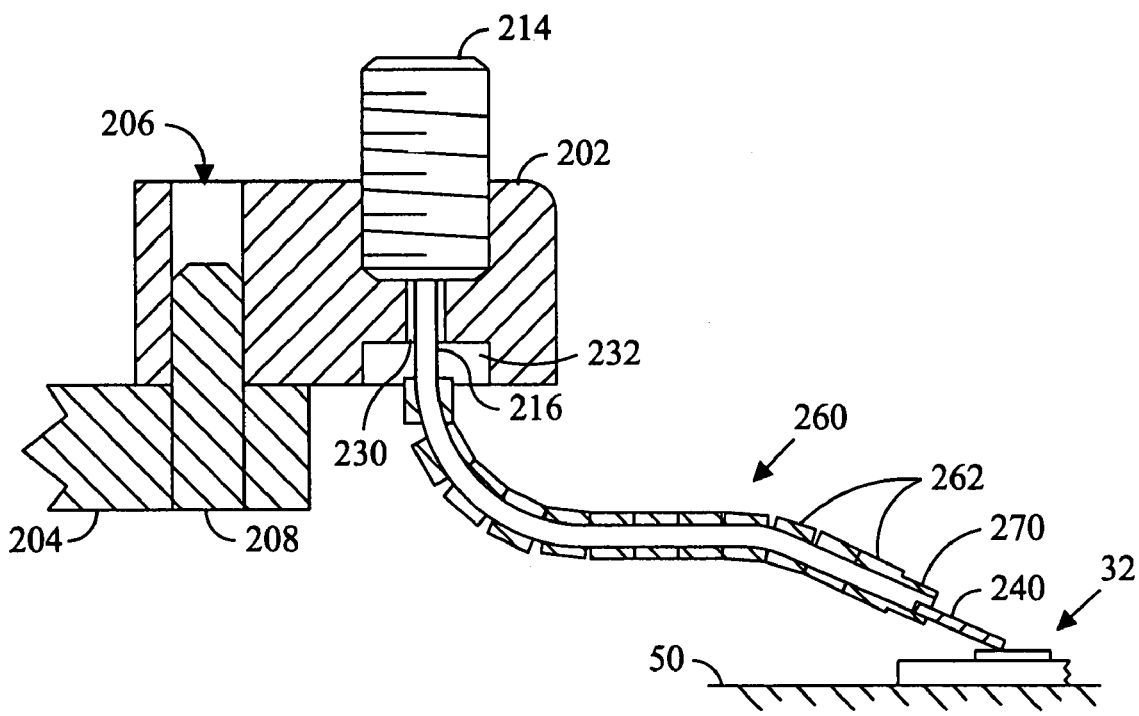
FIG. 4 is a section view of the probe of FIG. 3 taken along line A-A.

Referring FIGS. 3 and 4, the probe 200 with integral balun comprises a support block 202 which is suitably constructed for connection to a movable probe supporting member 204 of a probe station. For example, the support block includes an aperture 206 for engagement by a snugly fitting alignment pin 208 that projects vertically from the probe supporting member. In addition, the support block includes a pair of countersunk apertures 210 to accept a pair of fastening screws 212 arranged to engage threaded holes in the probe supporting member and secure the probe to the probe supporting member.

The probe includes an input port 214 which, in the embodiment depicted, comprises spark-plug type, K-connector. This connector enables the external connection of an ordinary coaxial cable permitting a well shielded high frequency transmission channel to be established between the probe and the network analyzer or other test instrumentation. If desired, other types of connectors can be used, such as a 2.4 mm. connector, a 1.85 mm. connector or a 1 mm. connector.

Figure 5:
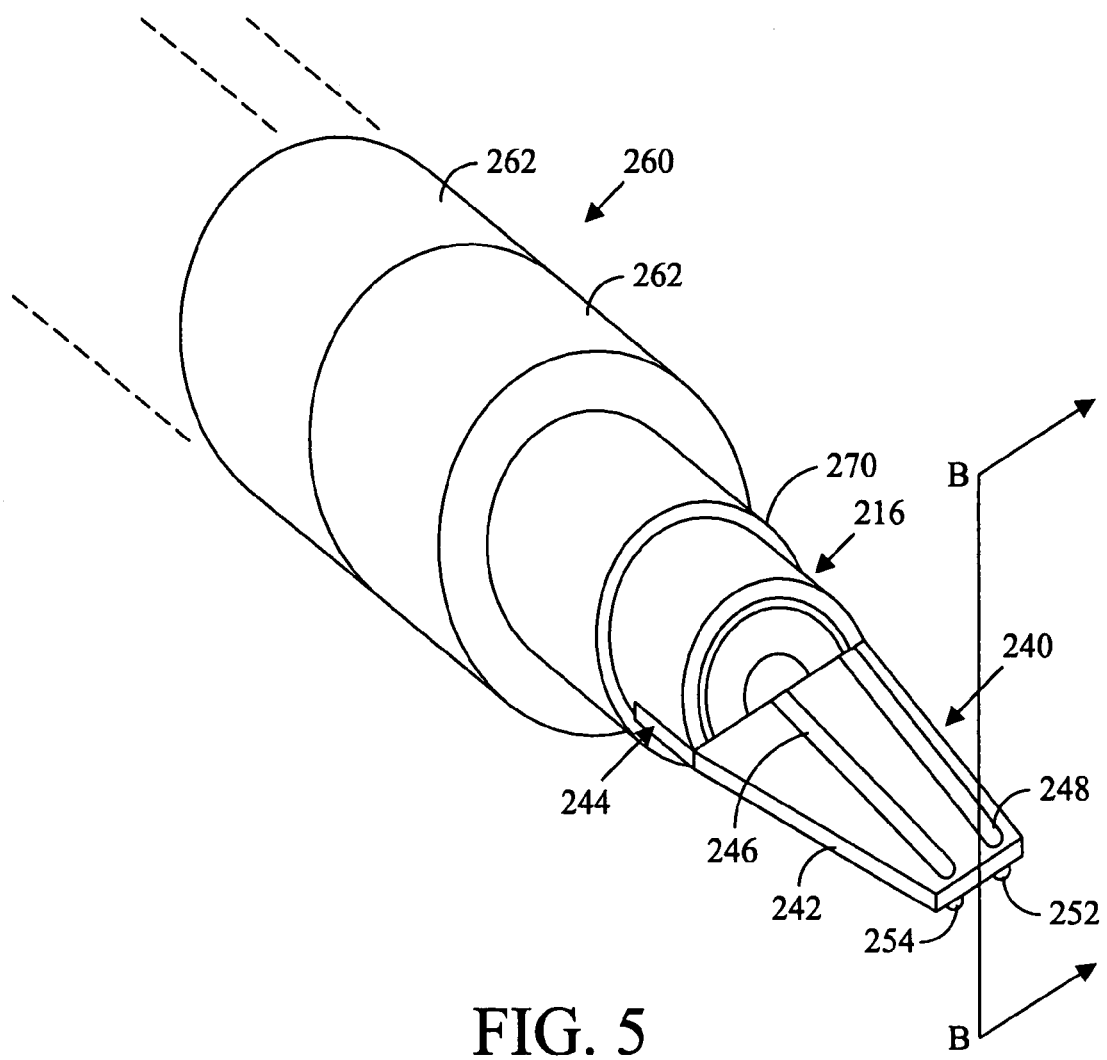
FIG. 5 is a perspective view of a probe head and a free end of a coaxial cable of the probe of FIG. 3.
Figure 6:
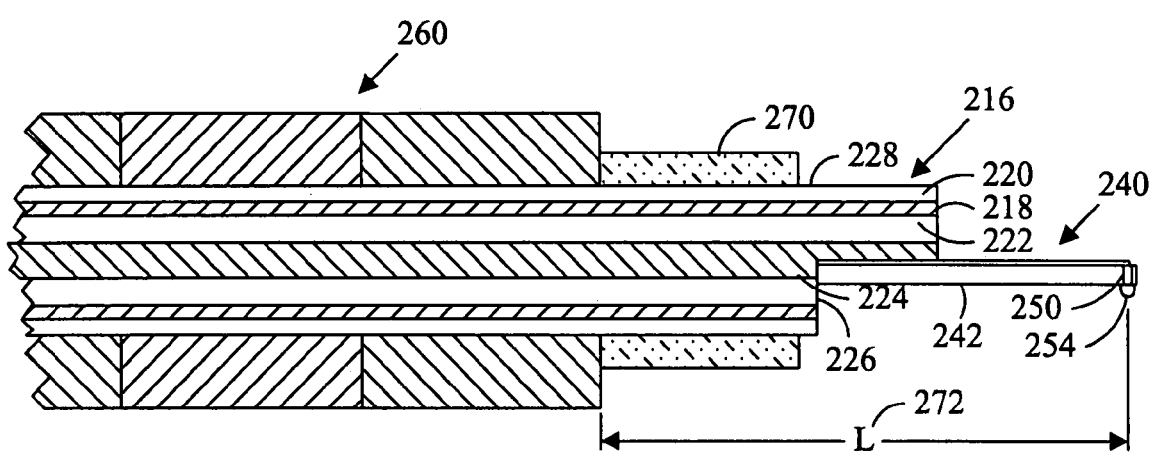
FIG. 6 is a section view of the probe head and the free end of the coaxial cable of FIG. 5 taken along line B-B.

In the depicted embodiment, a semi-rigid coaxial cable 216 is connected at its rearward end to the K-connector comprising the port of the probe. Referring also to FIGS. 5 and 6, the coaxial cable 216 preferably includes an elongate, tubular outer conductor 218 having an outer surface 220 and an inner surface 222, an inner conductor arranged within and coaxial with the inner surface of the outer conductor and an inner dielectric 226 that separates the inner conductor from the inner surface of the outer conductor for a length of the inner conductor. Preferably the coaxial cable is a phase-stable low-loss type cable. The coaxial cable may likewise include other layers of materials, as desired, and commonly includes an outer dielectric 228 encircling the outer surface of the outer conductor. To prepare the rearward end of the coaxial cable for connection to the K-connector, the rearward end is stripped to expose the inner conductor and this inner conductor is temporarily held inside a dummy connector while the adjacent outer conductor is soldered within a bore 230 formed in the primary support block. A recess 232 in the support block below this bore provides access to facilitate the soldering process. The dummy connector is then removed and the K-connector is screwed into a threaded opening formed in the block above the bore so as to effect electrical connection between the connector and the coaxial cable. A thread locking compound may be applied to the threads of the K-connector prior to its installation to ensure a secure physical connection.

The forward end of the coaxial cable remains freely suspended and, in this condition, serves as a movable support for a probe head 240 of the probe. Before being connected to the K-connector, the cables are bent along first and second intermediate portions in the manner shown so that a generally upwardly curving 90° bend and a downwardly curving bend, respectively, are formed in the cable.

The probe head 240 may be one of the many types of probe heads that have been developed for probing integrated circuits and other microelectronic devices. Godshalk et al., U.S. Pat. No. 5,506,515; Burr et al., U.S. Pat. No. 5,565,788; and Gleason et al., U.S. Pat. No. 6,815,963; assigned to Cascade Microtech Inc. and incorporated herein by reference, disclose a number of probe heads that may be utilized with the probe with integral balun. In a preferred embodiment, the probe 200 includes a microstrip style probe head comprising a dielectric sheet 242 having generally planar upper and lower surfaces that is affixed to the forward end of the coaxial cable. The underside of the cable is cut away to form a shelf 244, and the dielectric sheet is affixed to the shelf. Alternatively, the dielectric sheet may be supported by an upwardly facing shelf cut away from the cable or the end of the cable without a shelf. The dielectric sheet may comprise a flexible membrane or a plate of a more rigid dielectric material.

A pair of conductive signal traces are supported by the upper surface of the dielectric sheet. The conductive traces may be deposited, using any technique, or otherwise secured on the upper surface of the dielectric sheet. A first conductive signal trace 246 is electrically interconnected to the inner conductor 224 of the coaxial cable and a second conductive signal trace 248 is electrically interconnected to the outer conductor 218 of the coaxial cable . The respective conductive traces 246, 248 normally conduct the components of the differential input or output signals to or from the DUT. Other layers above, below, and/or between the conductive trace(s) and the dielectric sheet may be included, if desired.

Conductive vias 250 passing through the dielectric sheet enables transference of the signal path from the conductive traces on the upper surface of the sheet to the lower surface of the sheet. The conductive via provides a path from one side of the sheet to the other that is free from an air gap between the via and the dielectric for at least a majority of the thickness of the sheet and substantially reduces the capacitance of the signal path compared to a conductive finger extending over the end of the dielectric sheet.

The lower surface of the dielectric sheet includes a plurality of contact bumps or probe tips 252, 254 that are respectively electrically connected to the vias extending from the respective conductive traces on the upper surface of the dielectric sheet. The probe tips are preferably arranged with the centroids of their lower ends being substantially aligned and generally parallel to the forward edge of the probe head. The probe tips are spatially arranged proximate to each other so as to be co-locatable with respective probe pads that conduct signals for the test structure that is to be probed. It is to be understood that the probe tips may take any suitable form, such as a bump, a patterned structure, or an elongate conductor.

Figure 7:
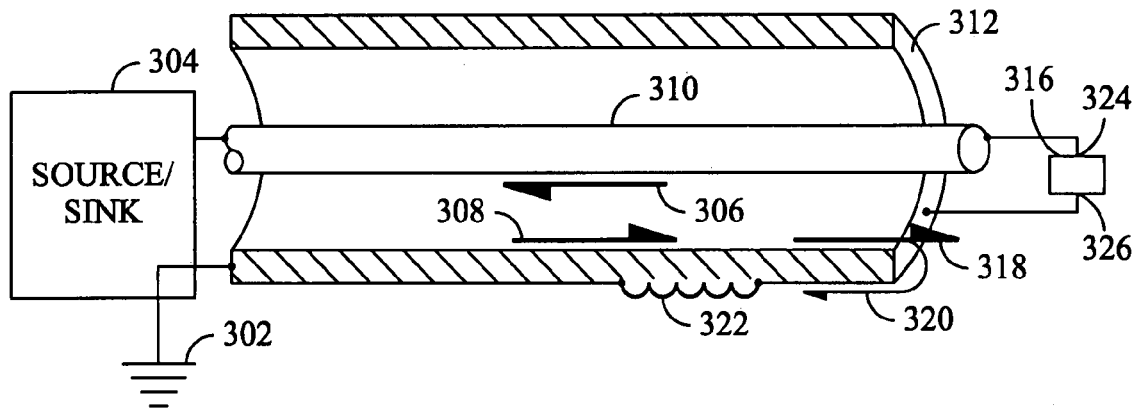
FIG. 7 is a schematic view of current flows in a coaxial cable.

An integral balun 260 comprising a sleeve of magnetically permeable material substantially encircles a length of the outer surface of the outside conductor 218 of the coaxial cable 216 connecting the probe tip 250 and the probe's port 214. Referring to FIG. 7, a coaxial cable typically comprises two conductors, an elongate, tubular outer conductor 312 having an inner surface and an outer surface and an inner conductor 310 arranged within the aperture defined by the inner surface of the outer conductor and separated from the outer conductor by a dielectric. As a result of skin effect, the two conductors of the coaxial cable comprise three conductive paths: the inner conductor, the inner surface of the outer conductor and the outer surface of the outer conductor. When a single ended signal is transmitted to or from a source 304 on a coaxial cable one of the conductors, typically the outer conductor, is connected to ground 302 and the signal 306 is transmitted over the second conductor, typically the inner conductor. Since the electrical and magnetic fields produced by the signal flowing in the inner conductor are confined to the space separating the inner and outer conductors, a current 308 equal in magnitude to the signal but flowing in the opposite direction will flow on the inner surface of the outer conductor. At the second end of the outer conductor, a first portion 318 of the current flowing on the inner surface of the outer conductor will be transferred to the load 316 and, depending upon the relative impedances, a second portion of the current, an unbalance current 320, will flow back to ground on the outer surface of the outer conductor or be radiated from the outer conductor. The balun, the magnetically permeable sleeve 260, acts as an inductor 322 in the conductive path comprising the outer surface of the outer conductor to impede and substantially block the flow of the unbalance current on the outer surface of the outer conductor. As a result, equal and opposite differential signals, comprising the signal 306 and the current 308/318, are conducted between the inner and outer conductors of the coaxial cable and the ports 324, 326 of the load 316 which comprise the sinks for the components of the differential signal.

Similarly, when equal and opposite differential signals are sourced from the pair of ports 324, 326 of the load to the inner and outer conductors of the coaxial cable, the impedance introduced in the conductive path on the outer surface of the outer conductor by the magnetically permeable sleeve substantially blocks current flow over the outer surface of the outer conductor, confining the signals to the inner conductor and the inner surface of the outer conductor even though the outer conductor is grounded 302 at the opposite end of the cable and a single ended signal is conducted to the sink 304.

Figure 8:
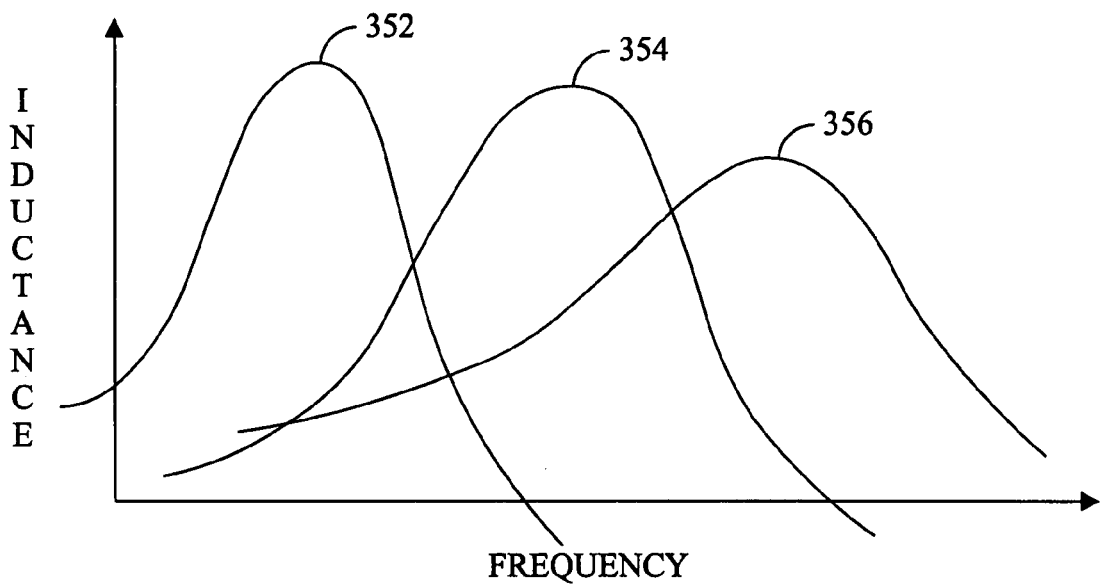
FIG. 8 is a graphical representation of inductance versus frequency for a plurality of magnetically permeable materials.

The magnetically permeable sleeve balun 260 comprises a plurality of magnetically permeable tubes or beads 262 arranged end-to-end along a length of the coaxial cable 216. The beads typically comprise ferrite toroids that substantially encircle the outer surface of the coaxial cable but the beads may comprise one or more non-continuous sections arranged around the circumference of the cable. Ferrites are typically ceramic ferromagnetic materials. The ingredients are mixed, fired, crushed or milled, and pressed or extruded and fired to form their final shape. Ferrites may comprise rare earth, such as cobalt, but the most common ferrites comprise about 50% iron oxide. The balance of the materials determines the grade of the final ferrite and commonly comprises a mixture of manganese or nickel and zinc or zinc-oxide. The magnetic permeability of ferrites is variable by varying the composition and the method of making of the ferrite. Referring to FIG. 8, the inductance produced by a ferrite bead is related to the ferrite's magnetic permeability and varies with frequency. To provide a probe useful over a wide range of frequencies, a preferred embodiment of the magnetic permeable sleeve balun comprises a plurality of beads comprising a plurality of differing ferrite materials 352, 354, 354 arranged so that the magnetic permeability of the beads is progressively higher as the distance from the probe tip increases. Moreover, the inductance of the magnetic sleeve balun is maximized at intervals of one-fourth of the wavelength of the signal being attenuated. In a preferred embodiment, the distance, L, 272 between the probe tips 254 and the end of the magnetic sleeve nearest the probe tips is less than one-half of the wavelength of the highest frequency to be measured by the probe and preferably less than thirty-five percent (35%) and more than fifteen percent (15%) of the wavelength of highest frequency and, more preferably, approximately one-fourth of the wavelength of the highest frequency to be measured. Similarly, it is preferable that the distance from the probe tips to a portion of the balun comprising a ferrite exhibiting a maximum inductance at a particular frequency be approximately one-fourth of wavelength of the frequency at which the inductance is maximized for the ferrite.

Although the balun substantially blocks the imbalance current which might flow on the outer surface of the outer conductor, a current can be induced in the outer conductor as a result of the presence of the conductor in the radiation fields of the probe pads. To reduce inducement of current by the radiation field, the protruding end of the coaxial cable may be slidably inserted into a tube 270 comprising a semi-flexible microwave-absorbing material. One material used for forming the tube comprises iron and urethane. The semi-flexible tube of microwave absorbing material serves to substantially reduce the levels of induced microwave energy that can travel along the outer conductor of the cable.

Figure 9:
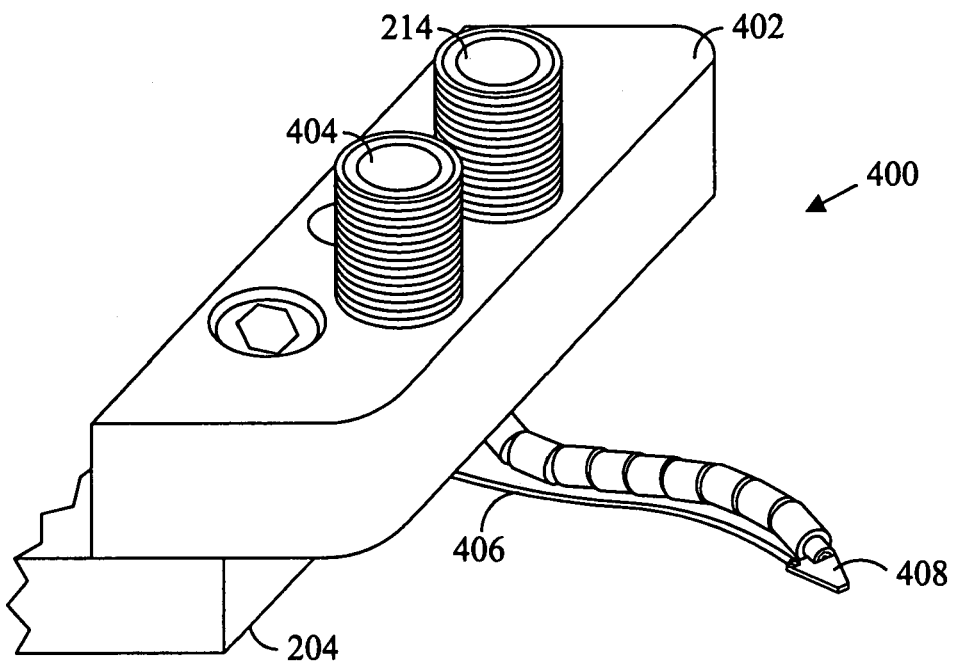
FIG. 9 is a perspective view of a probe with an integral balun that incorporates a biasing interconnection.
Figure 10:
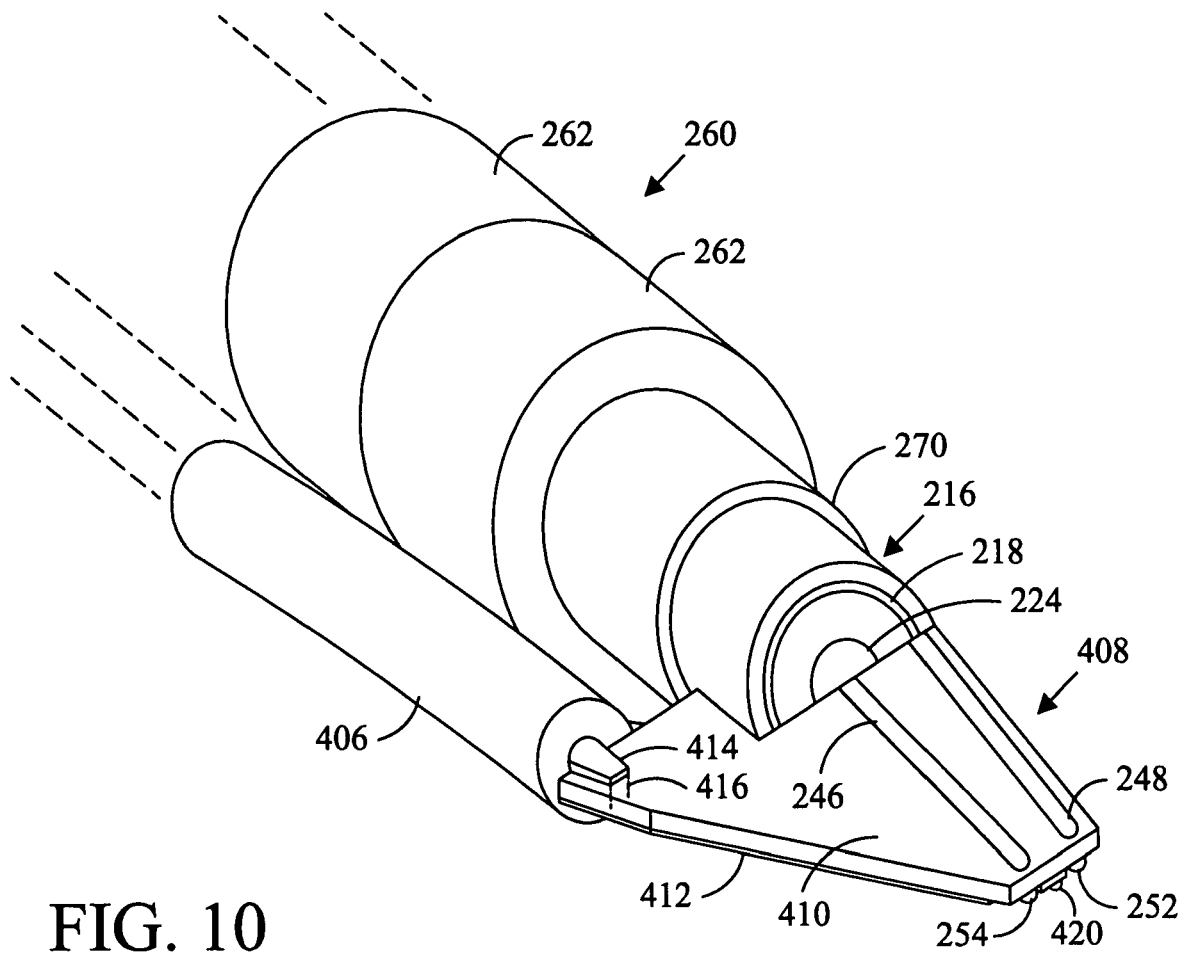
FIG. 10 is a perspective view of a probe head and conductors of the probe of FIG. 9.

Referring to FIGS. 9 and 10, an additional embodiment of the probe 400 with integral balun includes a third probe tip 402 connectable to bias the DUT. The support block 402 includes an additional input port 404 which, in the embodiment depicted, comprises spark-plug type, K-connector enabling connection of the DC bias from the network analyzer. In the depicted embodiment, a cable 406 is connected at its rearward end to the second port of the probe and extends from the support block to the probe head 408.

The probe 408 comprising a dielectric sheet 410 has generally planar upper and lower surfaces and is affixed to the forward end of the coaxial cable 216. A first conductive signal trace 246 is electrically interconnected to the inner conductor 224 of the coaxial cable and a second conductive signal trace 248 is electrically interconnected to the outer conductor 218 of the coaxial cable. The respective conductive traces conduct the components of the differential input or output signals to or from the DUT. Conductive vias extend through the dielectric sheet enabling transference of the signal path from the conductive traces on the upper surface of the sheet to the lower surface of the sheet the contact bumps or probe tips 252, 254.

The conductor 414 of the cable 406 is conductively affixed to a via 416 extending from the bottom of the dielectric sheet to its top surface. A conductive trace 412 affixed to the lower surface of the dielectric sheet connects the via to a centrally located probe tip 420. The conductive layer may, if desired, cover substantially all of the lower surface of the dielectric sheet with the exception of clearance areas around the signal probe tips 252 and 254.

The probe with integral balun enables a two port network analyzer to be used without costly external baluns in probing integrated circuits and other microelectronic devices with differential signals.

The detailed description, above, sets forth numerous specific details to provide a thorough understanding of the present invention. However, those skilled in the art will appreciate that the present invention may be practiced without these specific details. In other instances, well known methods, procedures, components, and circuitry have not been described in detail to avoid obscuring the present invention.

The detailed description, above, sets forth numerous specific details to provide a thorough understanding of the present invention. However, those skilled in the art will appreciate that the present invention may be practiced without these specific details. In other instances, well known methods, procedures, components, and circuitry have not been described in detail to avoid obscuring the present invention.

All the references cited herein are incorporated by reference.

The terms and expressions that have been employed in the foregoing specification are used as terms of description and not of limitation, and there is no intention, in the use of such terms and expressions, of excluding equivalents of the features shown and described or portions thereof, it being recognized that the scope of the invention is defined and limited only by the claims that follow.

We claim:

1. A probe for connecting one of a sink of a differential signal to a source of a single ended signal and a source of a differential signal to a sink of a single ended signal, said sink of said differential signal comprising a sink of a first differential signal component and a sink of a second differential signal component and said source of said differential signal comprising a source of said first differential signal component and a source of said second differential signal component, said probe comprising: (a) an elongate coaxial cable comprising: (i) a tubular outer conductor having an outer surface, an inner surface, a first end and a second end; and (ii) an inner conductor arranged within said inner surface of said outer conductor and having a first end proximate said first end of said outer conductor and a second end, said second end of said inner conductor and said second end of said outer conductor operatively connected to one of said source and said sink of said single ended signal and said first end of said outer conductor operatively connected to the respective one of said sink and source of said first differential signal component and said first end of said inner conductor operatively connected to the respective one of said sink and said source of said second differential signal component; and (b) a magnetically permeable sleeve having an inner surface substantially encircling a length of said coaxial cable and an outer surface.

2. The probe of claim 1 wherein said magnetically permeable sleeve comprises:

(a) a first sleeve proximate said first end of said outer conductor; and
(b) a second sleeve more remote from said first end of said outer conductor than said first sleeve, said second sleeve not interconnected with said first sleeve.

3. The probe of claim 1 wherein said magnetically permeable sleeve comprises:
(a) a first sleeve proximate said first end of said outer conductor and having a first magnetic permeability; and
(b) a second sleeve more remote from said first end of said outer conductor than said first sleeve and having a second magnetic permeability, said first magnetic permeability differing from said second magnetic permeability.

4. The probe of claim 3 wherein said second magnetic permeability is greater than said first magnetic permeability.

5. The probe of claim 1 wherein said sleeve includes a first end proximate said first end of said outer conductor and spaced apart from a connection of said outer conductor to the respective one of said source of said first differential signal component and said sink of said first differential signal component by a distance no greater than one-half of one wavelength of the highest frequency to be communicated by said probe.

6. The probe of claim 1 wherein said sleeve includes a first end proximate said first end of said outer conductor and spaced apart from a connection of said outer conductor to the respective one of said source of said first differential signal component and said sink of said first differential signal component by a distance no greater than thirty-five percent of a wavelength of the highest frequency to be communicated by said probe and a distance no less than fifteen percent of said wavelength.

7. The probe of claim 1 wherein said sleeve includes a first end proximate said first end of said outer conductor and spaced apart from a connection of said outer conductor to the respective one of said source of said first differential signal component and said sink of said first differential signal component by a distance no greater than thirty percent of a wavelength of the highest frequency to be communicated by said probe and a distance no less than twenty percent of said wavelength.

8. The probe of claim 1 wherein said sleeve includes a first end proximate said first end of said outer conductor and spaced apart from a connection of said outer conductor to the respective one of said source of first differential signal component and said sink of first differential signal component by a distance no greater than twenty-six percent of a wavelength of the highest frequency to be communicated by said probe and a distance no less than twenty-four percent of said wavelength.

9. The probe of claim 1 further comprising a microwave absorber at least partially encircling said coaxial cable for a portion of a distance between said first end of said outer conductor and an end of said magnetically permeable sleeve nearer said first end of said outer conductor.

10. The probe of claim 1 wherein said source and said sink of said single ended signal comprises a ground connectable to said outer conductor.

11. The probe of claim 1 further comprising a third conductor interconnecting a source of a bias and a bias terminal of a device comprising said source and said sink of said differential signal.

12. A probe comprising: (a) a support block securable to a movable probe supporting member; (b) an elongate coaxial cable secured to said support block, said coaxial cable comprising: (i) an elongate tubular outer conductor having an outer surface, an inner surface, a first end and a second end; (ii) an inner conductor arranged within said inner surface of said outer conductor and having a first end proximate said first end of said outer conductor, a second end proximate said second end of said outer conductor, said first end of said inner conductor and said first end of said outer conductor operatively connected to one of a source and a sink of a single ended signal; (c) a magnetically permeable sleeve having an inner surface substantially encircling a length said coaxial cable; and (d) a probe head secured to said elongate coaxial cable proximate said second end of said outer conductor and comprising a first probe tip conductively connected to said second end of said outer conductor and a second probe tip conductively connected to said second end of said inner conductor, said probe converting a single ended signal communicated to said first end of said inner and outer conductors to a first differential signal component at said first probe tip and a second differential signal component at said second probe tip and converting a first differential signal component communicated to said first probe tip and a second differential signal component communicated to said second probe tip to a Single ended signal at said first ends of said inner and outer conductors.

13. The probe of claim 12 wherein said magnetically permeable sleeve comprises:
(a) a first rigid sleeve proximate said second end of said outer conductor; and
(b) a second rigid sleeve more remote from said second end of said outer conductor than said first sleeve, said first rigid sleeve not interconnected with said second rigid sleeve.

14. The probe of claim 12 wherein said magnetically permeable sleeve comprises:
(a) a first sleeve proximate said second end of said outer conductor and having a first magnetic permeability; and
(b) a second sleeve more remote from said second end of said outer conductor than said first sleeve and having a second magnetic permeability, said first magnetic permeability differing from said second magnetic permeability.

15. The probe of claim 14 wherein said second magnetic permeability is greater than said first magnetic permeability.

16. The probe of claim 12 wherein said sleeve includes a first end proximate said second end of said outer conductor and spaced apart from said first probe tip by a distance no greater than one-half of one wavelength of the highest frequency to be communicated by said probe.

17. The probe of claim 12 wherein said sleeve includes a first end proximate said second end of said outer conductor and spaced apart from said first probe tip by a distance no greater than thirty-five percent of a wavelength of the highest frequency to be communicated by said probe and a distance no less than fifteen percent of said wavelength.

18. The probe of claim 12 wherein said sleeve includes a first end proximate said second end of said outer conductor and spaced apart from said first probe tip by a distance no greater than thirty percent of a wavelength of the highest frequency to be communicated by said probe and a distance no less than twenty percent of said wavelength.

19. The probe of claim 12 wherein said sleeve includes a first end proximate said second end of said outer conductor and spaced apart from first probe tip by a distance no greater than twenty-six percent of a wavelength of the highest frequency to be communicated by said probe and a distance no less than twenty-four percent of said wavelength.

20. The probe of claim 12 further comprising a microwave absorber at least partially encircling said coaxial cable for a portion of a distance between said first probe tip and an end of said magnetically permeable sleeve nearest said first probe tip.

21. The probe of claim 12 wherein said source and said sink of said single ended signal comprises a ground connectable to said outer conductor.

22. The probe of claim 12 further comprising a third conductor connectible to interconnect a source of a bias to a third probe tip.

* * * * *